US010963598B2

(12) United States Patent
McCool et al.

(10) Patent No.: US 10,963,598 B2
(45) Date of Patent: Mar. 30, 2021

(54) COMPUTER SYSTEM AND METHOD FOR MANAGING COORDINATION ISSUES IN CONSTRUCTION PROJECTS

(71) Applicant: Procore Technologies, Inc., Carpinteria, CA (US)

(72) Inventors: Dave McCool, Carpinteria, CA (US); Chris Bindloss, Santa Barbara, CA (US)

(73) Assignee: Procore Technologies, Inc., Carpinteria, CA (US)

( * ) Notice: Subject to any disclaimer, the term of this patent is extended or adjusted under 35 U.S.C. 154(b) by 0 days.

(21) Appl. No.: 16/276,272

(22) Filed: Feb. 14, 2019

(65) Prior Publication Data

US 2020/0151287 A1    May 14, 2020

Related U.S. Application Data

(60) Provisional application No. 62/760,904, filed on Nov. 13, 2018.

(51) Int. Cl.
*G06F 30/00* (2020.01)
*G06F 30/13* (2020.01)
(Continued)

(52) U.S. Cl.
CPC .......... *G06F 30/13* (2020.01); *G06F 3/04815* (2013.01); *G06Q 10/103* (2013.01); *G06Q 50/08* (2013.01); *G06T 19/003* (2013.01)

(58) Field of Classification Search
None
See application file for complete search history.

(56) References Cited

U.S. PATENT DOCUMENTS 8,898,158 B2 * 11/2014 Martin ................... G06Q 10/00
707/729
9,070,216 B2 * 6/2015 Golparvar-Fard ..........................
G06Q 10/06311
(Continued)

FOREIGN PATENT DOCUMENTS

KR    10-1827227 B1    3/2018

OTHER PUBLICATIONS

PCT International Searching Authority, International Search Report and Written Opinion dated Mar. 10, 2020, issued in connection with International Application No. PCT/US2019/060796, filed on Nov. 11, 2019, 9 pages.

*Primary Examiner* — Martin Mushambo
(74) *Attorney, Agent, or Firm* — Lee Sullivan Shea & Smith LLP

(57) ABSTRACT

The present disclosure is directed to a software tool that facilitates coordination between various parties that are involved in the process of rectifying a problem identified in a combined three-dimensional model file. In one implementation, the software tool may cause a computing device to (a) receive an indication requesting creation of a coordination issue that relates to a portion of a rendered three-dimensional view of a construction project, (b) in response to the receipt of the indication, create a data set defining the coordination issue, the data set including (i) a representation of the portion of the rendered three-dimensional view, and (ii) data indicating an assignee of the coordination issue, and (c) cause an indication of the coordination issue to be presented to a client station associated with the assignee.

20 Claims, 18 Drawing Sheets
(15 of 18 Drawing Sheet(s) Filed in Color)

(51) Int. Cl.
   *G06Q 10/10*     (2012.01)
   *G06Q 50/08*     (2012.01)
   *G06F 3/0481*    (2013.01)
   *G06T 19/00*     (2011.01)

(56)        References Cited

U.S. PATENT DOCUMENTS

2004/0015556 A1    1/2004  Chopra
   2006/0085322 A1*   4/2006  Crookshanks ......... G06Q 40/04
                                                        705/37
   2008/0071562 A1*   3/2008  Clemenson ............ G06Q 10/06
                                                        705/7.12
   2010/0077316 A1*   3/2010  Omansky ............... G06Q 10/10
                                                        715/751
   2011/0213631 A1    9/2011  Mislavsky
   2012/0203806 A1    8/2012  Panushev
   2012/0310602 A1   12/2012  Jacobi et al.
   2014/0344181 A1   11/2014  Brown
   2015/0169791 A1*   6/2015  Lavrov ................... G06T 19/00
                                                        703/1
   2015/0193711 A1    7/2015  Lavrov et al.

* cited by examiner

COMPUTER SYSTEM AND METHOD FOR MANAGING COORDINATION ISSUES IN CONSTRUCTION PROJECTS

CROSS-REFERENCE TO RELATED APPLICATION

This application claims the benefit of priority under 35 U.S.C. § 119(e) to U.S. provisional application No. 62/760,904, filed on Nov. 13, 2018 and titled "Managing Coordination Issues and Navigating Building Information Models," the contents of which is incorporated by reference herein in its entirety.

BACKGROUND

Construction projects are often complex endeavors involving the coordination of many professionals across several discrete phases. Typically, a construction project commences with a design phase, where architects design the overall shape and layout of a construction project, such as a building. Next, engineers step in during a planning phase where they take the architects' designs and produce engineering drawings and plans for the construction of the project. At this stage, engineers may also design various portions of the project's infrastructure, such as HVAC, plumbing, electrical, etc., and produce plans reflecting these designs as well. After, or perhaps in conjunction with, the planning phase, contractors may step in during a logistics phase to review these plans and begin to allocate various resources to the project, including determining what materials to purchase, scheduling delivery, and developing a plan for carrying out the actual construction of the project. Finally, during the construction phase, construction professionals begin to construct the project based on the finalized plans.

Although this is a simplified overview of what is a complex and iterative procedure, it is clear that in order to successfully complete a construction project, many separate teams of individuals must communicate and coordinate their efforts over a long period of time. Thus, any tool that can make portions of this process more efficient is desired.

OVERVIEW

As a general matter, one phase of a construction project involves the creation, review, and sometimes revision, of plans of the construction project. In most cases, these plans comprise visual representations of the construction project that visually communicate information about the construction project, such as how to assemble or construct the project. Such visual representations tend to take one of at least two different forms. One form may be a two-dimensional technical drawing, such as an architectural drawing or a construction blueprint, in which two-dimensional line segments of the drawing represent certain physical elements of the construction project like walls and ducts. In this respect, a two-dimensional technical drawing could be embodied either in paper form or in a computerized form, such as an image file (e.g., a PDF, JPEG, etc.)

To advance over two-dimensional technical drawings, computerized, three-dimensional technology was developed as another form in which information about a construction project can be visually communicated. In this respect, a three-dimensional model of the construction project is typically embodied in a computerized form, such as in a building information model (BIM) file, with three-dimensional meshes visually representing the physical elements of the construction project (e.g., walls, ducts, etc.). Correspondingly, specialized software has been developed that is capable of accessing a BIM file and, based on this BIM file, rendering a three-dimensional view of the construction project from one or more perspectives.

BIM files and rendered three-dimensional views based on such BIM files may be used throughout the construction planning process by many different construction professionals in order to provide a visualization of the construction project. The process for creating a BIM file may involve input from various different individuals (or different teams of individuals), who have various different roles with respect to the process of creating the BIM file. For example, a structure team may create a BIM file that models the walls, floors, and ceilings of the construction project, an HVAC team may create another BIM file that models the HVAC equipment and associated ductwork throughout the construction project, and a plumbing team may create yet another BIM file that models the plumbing systems of the construction project.

In practice, another team of individuals—which may be referred to as the virtual design and construction (VDC) team—may then take all of these disparate BIM files and assemble them into a single combined BIM file that reflects the entire construction project. However, after combining the disparate BIM files into the combined BIM file and reviewing the combined BIM file in BIM viewer software, an individual (such as a VDC team member) may identify one or more problems with the combined BIM file, such as an unintended intersection between two meshes, insufficient clearance between two meshes, or meshes that are missing, misshapen, or are otherwise ill-positioned in the construction project, among other examples.

Once a problem with the combined BIM file is identified, the VDC team may then be tasked with developing a plan to rectify such a problem. In this respect, it may be possible for the VDC team to resolve some types of problems itself, without involving other individuals or teams of individuals. For example, a problem identified in the combined BIM file could be the result of a simple error by one of the parties that created the underlying BIM files, in which case the VDC team may be able to rectify such a problem without involving others. However, other types of problems may require the VDC team to get another individual (or team of individuals) involved before the VDC team can rectify the problem. For example, a problem identified in the combined BIM file may require a change to contract documents and/or a change the actual scope of work between the general contractor and the owner of the construction project, in which case the VDC team would typically need to get one or more other individuals (or teams of individuals) involved before the problem can be rectified.

Based on the foregoing, it will be appreciated that rectifying a problem identified in a combined BIM file (or the like) may involve coordination between multiple different parties (where a "party" may be an individual or a team of individuals), which may introduce time delays and other inefficiencies into the process of creating a combined BIM file. For example, once the VDC team notifies the necessary parties about a problem identified in a combined BIM file, the plan for resolving that problem is often slow to make its way back to the VDC team—or worse, fails to reach the VDC team altogether. As a result, the problem originally identified by the VDC team will remain open, potentially blocking work and delaying completion of the construction project.

Moreover, to the extent it exists at all, existing software technology that can be used to communicate problems identified in a combined BIM file (or the like) is limited, and fails to provide for timely, reliable coordination of different parties that are involved in the process of rectifying a problem identified in a combined BIM file.

To address these problems (among others), disclosed herein is software technology that facilitates coordination between various parties that are involved in the process of rectifying a problem identified in a combined three-dimensional model file, such as a BIM file. This software technology—which may be referred to herein as a "coordination tool"—may comprise a front-end portion that may be executed by one or more client stations and a back-end portion that may be executed by a back-end platform. Further, in practice, the front-end portion of the disclosed coordination tool may be integrated into or otherwise interface with a software application for viewing a three-dimensional model of a building, such as a BIM viewer.

According to an example embodiment, a first party (e.g., an individual associated with a VDC team) may first use a software application running on a first client station to navigate through a three-dimensional view rendered using a combined three-dimensional model file to identify potential problems within the three-dimensional model file. Once a problem is identified, the first party can then utilize the first client station to access a front-end portion of the disclosed coordination tool, which may be used to initiate and coordinate a process for rectifying the problem identified in the combined three-dimensional model file. This process may involve various actions to be performed by various different parties.

For instance, when a problem is identified, the first party can initiate the process for rectifying the problem by providing (i) a request to the front-end portion of the disclosed coordination tool to create what is referred to herein as a "Coordination Issue" as well as (ii) additional information to associate with the Coordination issue, such as perhaps one or more screenshots of the three-dimensional model file, a title of the Coordination Issue, a description of the Coordination Issue, a location of the Coordination Issue, an assignee of the Coordination Issue, and a date by which the Coordination Issue should be resolved, among other possibilities. As used herein, Coordination Issue generally refers to a data structure that contains an indication that some aspect of the construction project may need to be addressed, as well as perhaps other information, such as the party responsible for addressing the aspect, a due date, and a location, among other kinds of information.

After receiving the foregoing information, the first client station executing the front-end portion of the disclosed coordination tool may receive an input indicating that the Coordination Issue should be saved at which point the first client station may send to a back-end platform a request to create and save the Coordination Issue.

Back-end platform may then create and store a master copy of the Coordination Issue and set the status of the Coordination Issue to "open." Once the Coordination Issue is created, back-end platform may optionally send an assignee of the Coordination Issue a notification (via email, in-app notification, or in some other manner) that there is a Coordination Issue that needs to be addressed.

Back-end platform may make the Coordination Issue data accessible to other users at other client stations executing other instances of the disclosed coordination tool, including to the first party via the first client station. In this way, the first party (or any other party) may review the Coordination Issue to determine if the issue is one that can be rectified with little to no involvement of additional parties. If, in the determination of the first party, one or more additional parties should be involved in the process for rectifying the issue, the first party may then provide the first client station (or any other client station the party is accessing) an instruction to create an RFI linked to the Coordination Issue. As used herein, an RFI is an additional data structure that contains an indication that a previously-identified Coordination Issue is unable to be immediately rectified and that the input of one or more additional parties is requested.

When a client station executing the front-end portion of the disclosed coordination tool receives an indication that a particular Coordination Issue should be elevated to an RFI, then the client station may present to the first party certain fields that allow the party to input additional information to associate with the draft RFI. Such additional information may include the relevant snapshots of the Coordination Issue from the three-dimensional view of the construction project as well as, perhaps, other location information. The client station may also allow the first party to select a second party to handle the RFI.

After the first party inputs the foregoing information and confirms, the first client station may interact with the back-end platform by sending to the back-end platform a request to create the RFI, which may include any additional information collected as set forth above. Responsively, the back-end platform may create the RFI, link the RFI to the Coordination Issue, and update the status of the Coordination Issue to "Elevated to Draft RFI" (or "Elevated," for short). Once a draft RFI is created, back-end platform may make the draft RFI accessible to other users at other client stations executing other instances of the disclosed coordination tool, including to the first party via the first client station. In this way, the first party (or any other party) may review the draft RFI and save it as an open RFI.

Once the first party (or any other party) saves the draft RFI as an open RFI, the first client station (or any other client station the first party is accessing) may communicate this fact to the back-end platform, which may in turn assign an identifier (e.g., a unique number) to the RFI. The back-end platform may at this point send a notification to the second party identified to handle the RFI (via email, in-app notification, or in some other manner). The second party may then access the disclosed coordination tool via a second client station to review the draft open RFI. The second party may engage with the disclosed coordination tool at the second client station to provide an official response to the open RFI or mark the RFI complete (after, for instance, sufficiently rectifying the underlying problem in the combined three-dimensional model file).

In response to either or both of (1) receiving the response from the RFI manager or other user or (2) receiving an indication that the RFI was marked as complete, the second client station may provide back-end platform with an update message informing back-end platform of the response or that the RFI was marked complete. Responsively, back-end platform may update information associated with the Coordination Issue to reflect this change. Further, the back-end platform may, in some implementations, alert one or more users associated with the Coordination Issue, such as the first party, of the status change (via email, in-app notification, or in some other manner).

The disclosed coordination tool may also provide one or more screens that facilitate the above-described operations as well as provide a visualization of the progress of Coordination Issues. These screens may take various forms as will be described herein further. As one example, the screens provided by the disclosed coordination tool may present coordination issues on a "level-by-level" or a "floor-by-floor" basis, among other possibilities. In practice, these screens may be displayed by client station running the front-end portion of the disclosed coordination tool, which may in turn be driven by a back-end platform executing the back-end portion of the disclosed coordination tool. However, the screens provided by the disclosed coordination tool may be presented to a user in various other manners as well.

As set forth in more detail below, the disclosed software technology that integrates with a BIM viewer in order to create Coordination Issues and synchronize these created Coordination Issues between various teams may cause a computing system to engage in various other operations as well.

Accordingly, in one aspect, disclosed herein is a computer-implemented method that involves (a) receiving an indication requesting creation of a coordination issue that relates to a portion of a rendered three-dimensional view of a construction project, (b) in response to the receipt of the indication, creating a data set defining the coordination issue, the data set including (i) a representation of the portion of the rendered three-dimensional view, and (ii) data indicating an assignee of the coordination issue, and (c) causing an indication of the coordination issue to be presented to a client station associated with the assignee.

In another aspect, disclosed herein is a computing system that comprises at least one processor, a non-transitory computer-readable medium, and program instructions stored on the non-transitory computer-readable medium that are executable by the at least one processor to cause the computing system to carry out the operations disclosed herein, including but not limited to the operations of the foregoing method.

In yet another aspect, disclosed herein is a non-transitory computer-readable medium comprising program instructions that are executable to cause a computing system to carry out the operations disclosed herein, including but not limited to the operations of the foregoing method.

One of ordinary skill in the art will appreciate these as well as numerous other aspects in reading the following disclosure.

BRIEF DESCRIPTION OF THE DRAWINGS

Please note that this patent or application file contains at least one drawing executed in color. Copies of this patent or patent application publication with color drawing(s) will be provided by the Office upon request and payment of the necessary fee.

DETAILED DESCRIPTION

The following disclosure makes reference to the accompanying figures and several example embodiments. One of ordinary skill in the art should understand that such references are for the purpose of explanation only and are therefore not meant to be limiting. Part or all of the disclosed systems, devices, and methods may be rearranged, combined, added to, and/or removed in a variety of manners, each of which is contemplated herein.

I. Example System Configuration

The present disclosure is generally directed to software technology for managing construction projects, and in particular to a software tool that facilitates (i) the identification of Coordination Issues in a construction project, and (ii) the synchronization of these Coordination Issues among multiple instances of the software tool for use by multiple construction professionals. As one possible implementation, this software technology may include both front-end software running on client stations that are accessible to individuals associated with construction projects (e.g., contractors, project managers, architects, engineers, designers, etc., each of which may be referred to generally herein as a "construction professional") and back-end software running on a back-end platform (sometimes referred to as a "cloud" platform) that interacts with and/or drives the front-end software, and which may be operated (either directly or indirectly) by the provider of the front-end client software. As another possible implementation, this software technology may include front-end client software that runs on client stations without interaction with a back-end platform. The software technology disclosed herein may take other forms as well.

In general, such front-end client software may enable one or more individuals responsible for a construction project to perform various tasks related to the management of the construction project, which may take various forms. According to some implementations, these tasks may include: rendering three-dimensional views of the construction project, navigating through the various three-dimensional views of the construction project in order to observe the construction project from various perspectives, and identifying potential problems with the construction project that may require further attention by one or more construction professionals, and synchronizing the identified problem(s) among various, as some non-limiting examples. Further, such front-end client software may take various forms, examples of which may include a native application (e.g., a mobile application) and/or a web application running on a client station, among other possibilities.

Figure 1:
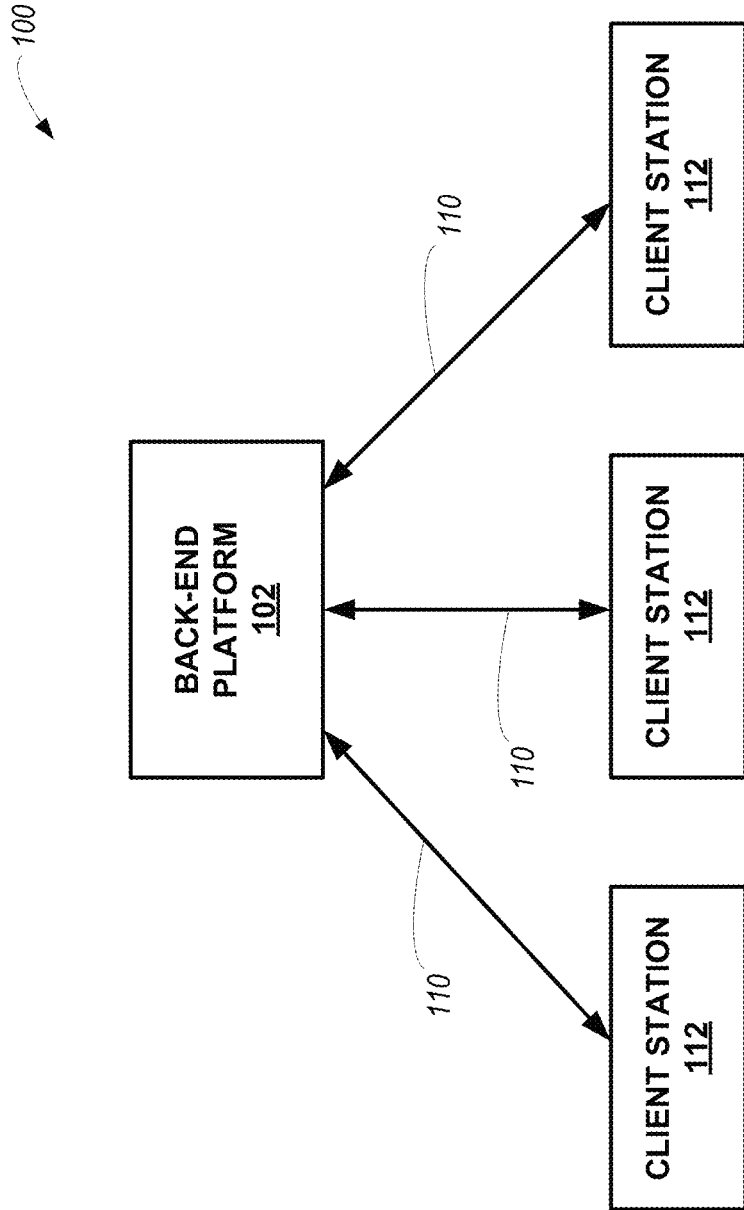
FIG. 1 depicts an example network configuration in which example embodiments may be implemented.

Turning now to the figures, FIG. 1 depicts an example network configuration 100 in which example embodiments of the present disclosure may be implemented. As shown in FIG. 1, network configuration 100 includes a back-end platform 102 that may be communicatively coupled to one or more client stations, depicted here, for the sake of discussion, as client stations 112.

Broadly speaking, back-end platform 102 may comprise one or more computing systems that have been provisioned with software for carrying out one or more of the functions disclosed herein, including but not limited to identifying Coordination Issues in a construction project, synchronizing these Coordination Issues among multiple instances of the software tool for use by multiple construction professionals, rendering three-dimensional views of models of a construction project, and/or transmitting data and/or instructions that cause one or more client stations 112 to output information related to a construction project, including the rendered views of the three-dimensional model of the construction project, and/or information related to the identified Coordination Issues. The one or more computing systems of back-end platform 102 may take various forms and be arranged in various manners.

For instance, as one possibility, back-end platform 102 may comprise computing infrastructure of a public, private, and/or hybrid cloud (e.g., computing and/or storage clusters) that has been provisioned with software for carrying out one or more of the functions disclosed herein. In this respect, the entity that owns and operates back-end platform 102 may either supply its own cloud infrastructure or may obtain the cloud infrastructure from a third-party provider of "on demand" computing resources, such include Amazon Web Services (AWS) or the like. As another possibility, back-end platform 102 may comprise one or more dedicated servers that have been provisioned with software for carrying out one or more of the functions disclosed herein. Other implementations of back-end platform 102 are possible as well.

In turn, client stations 112 may each be any computing device that is capable of running the front-end software disclosed herein. In this respect, client stations 112 may each include hardware components such as a processor, data storage, a user interface, and a network interface, among others, as well as software components that facilitate the client station's ability to run the front-end software disclosed herein (e.g., operating system software, web browser software, etc.). As representative examples, client stations 112 may each take the form of a desktop computer, a laptop, a netbook, a tablet, a smartphone, and/or a personal digital assistant (PDA), among other possibilities.

As further depicted in FIG. 1, back-end platform 102 is configured to interact with client stations 112 over respective communication paths 110. In this respect, each communication path 110 between back-end platform 102 and one of client stations 112 may generally comprise one or more communication networks and/or communications links, which may take any of various forms. For instance, each respective communication path 110 with back-end platform 102 may include any one or more of point-to-point links, Personal Area Networks (PANs), Local-Area Networks (LANs), Wide-Area Networks (WANs) such as the Internet or cellular networks, cloud networks, and/or operational technology (OT) networks, among other possibilities. Further, the communication networks and/or links that make up each respective communication path 110 with back-end platform 102 may be wireless, wired, or some combination thereof, and may carry data according to any of various different communication protocols. Although not shown, the respective communication paths 110 between client stations 112 and back-end platform 102 may also include one or more intermediate systems. For example, it is possible that back-end platform 102 may communicate with a given client station 112 via one or more intermediary systems, such as a host server (not shown). Many other configurations are also possible.

The interaction between client stations 112 and back-end platform 102 may take various forms. As one possibility, client stations 112 may send certain user input related to a construction project to back-end platform 102, which may in turn trigger back-end platform 102 to take one or more actions based on the user input. As another possibility, client stations 112 may send a request to back-end platform 102 for certain project-related data and/or a certain front-end software module, and client stations 112 may then receive project-related data (and perhaps related instructions) from back-end platform 102 in response to such a request. As yet another possibility, back-end platform 102 may be configured to "push" certain types of project-related data to client stations 112, such as rendered three-dimensional views, in which case client stations 112 may receive project-related data (and perhaps related instructions) from back-end platform 102 in this manner. As still another possibility, back-end platform 102 may be configured to make certain types of project-related data available via an API, a service, or the like, in which case client stations 112 may receive project-related data from back-end platform 102 by accessing such an API or subscribing to such a service. The interaction between client stations 112 and back-end platform 102 may take various other forms as well.

Although not shown in FIG. 1, back-end platform 102 may also be configured to receive data, such as data related to a construction project, from one or more external data sources, such as an external database and/or another back-end platform or platforms. Such data sources—and the data output by such data sources—may take various forms.

It should be understood that network configuration 100 is one example of a network configuration in which embodiments described herein may be implemented. Numerous other arrangements are possible and contemplated herein. For instance, other network configurations may include additional components not pictured and/or more or less of the pictured components.

II. Example Computing Device

Figure 2:
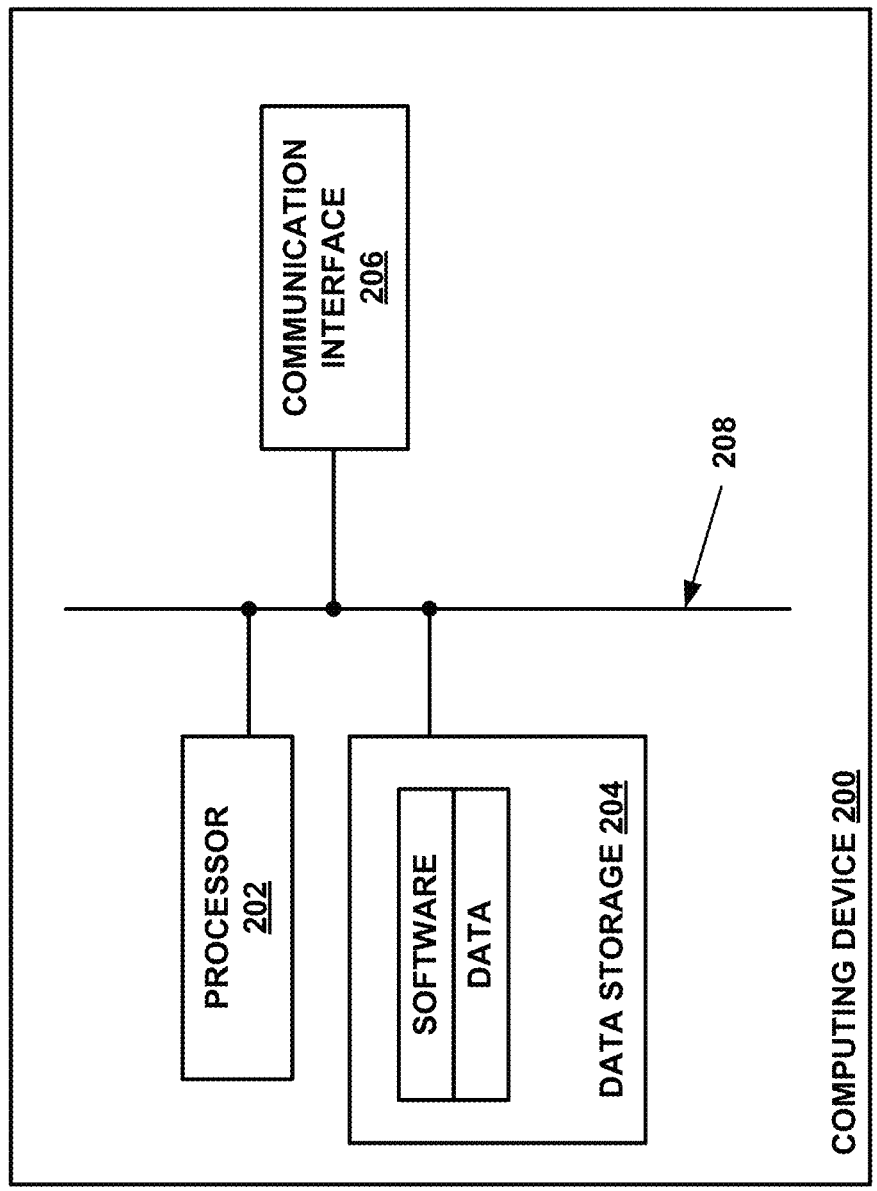
FIG. 2 depicts an example computing device that may be configured carry out one or more of the functions of the present disclosure.

FIG. 2 is a simplified block diagram illustrating some structural components that may be included in an example computing device 200, which could serve as, for instance, the back-end platform 102 and/or one or more of client stations 112 in FIG. 1. In line with the discussion above, computing device 200 may generally include at least a processor 202, data storage 204, and a communication interface 206, all of which may be communicatively linked by a communication link 208 that may take the form of a system bus or some other connection mechanism.

Processor 202 may comprise one or more processor components, such as general-purpose processors (e.g., a single- or multi-core microprocessor), special-purpose processors (e.g., an application-specific integrated circuit or digital-signal processor), programmable logic devices (e.g., a field programmable gate array), controllers (e.g., microcontrollers), and/or any other processor components now known or later developed. In line with the discussion above, it should also be understood that processor 202 could comprise processing components that are distributed across a plurality of physical computing devices connected via a network, such as a computing cluster of a public, private, or hybrid cloud.

In turn, data storage 204 may comprise one or more non-transitory computer-readable storage mediums, examples of which may include volatile storage mediums such as random-access memory, registers, cache, etc. and non-volatile storage mediums such as read-only memory, a hard-disk drive, a solid-state drive, flash memory, an optical-storage device, etc. In line with the discussion above, it should also be understood that data storage 204 may comprise computer-readable storage mediums that are distributed across a plurality of physical computing devices connected via a network, such as a storage cluster of a public, private, or hybrid cloud.

As shown in FIG. 2, data storage 204 may be provisioned with software components that enable the computing device 200 to carry out the operations disclosed herein. These software components may generally take the form of program instructions that are executable by the processor 202 to carry out the disclosed functions, which may be arranged together into software applications, virtual machines, software development kits, toolsets, or the like, all of which are referred to herein as a software tool or software tools. Further, data storage 204 may be arranged to store project-related data in one or more databases, file systems, or the like. Data storage 204 may take other forms and/or store data in other manners as well.

Communication interface 206 may be configured to facilitate wireless and/or wired communication with configured other computing devices or systems, such as one or more client stations 112 when computing device 200 serves as back-end platform 102, or as back-end platform 102 when computing device 200 serves as one of client stations 112. As such, communication interface 206 may take any suitable form for carrying out these functions, examples of which may include an Ethernet interface, a serial bus interface (e.g., Firewire, USB 3.0, etc.), a chipset and antenna adapted to facilitate wireless communication, and/or any other interface that provides for wireless and/or wired communication. Communication interface 206 may also include multiple communication interfaces of different types. Other configurations are possible as well.

Although not shown, computing device 200 may additionally include one or more other interfaces that provide connectivity with external user-interface equipment (sometimes referred to as "peripherals"), such as a keyboard, a mouse or trackpad, a display screen, a touch-sensitive interface, a stylus, a virtual-reality headset, speakers, etc., which may allow for direct user interaction with computing device 200.

It should be understood that computing device 200 is one example of a computing device that may be used with the embodiments described herein. Numerous other arrangements are possible and contemplated herein. For instance, other computing devices may include additional components not pictured and/or more or fewer of the pictured components.

III. Example Visual Representations of Construction Projects

As mentioned above, one aspect of managing a construction project involves the creation, review, and sometimes revision, of plans for the construction project. These plans assist construction professionals in carrying out the construction project. For example, some plans include written statements, such a punch list or submittal log, which may communicate, for instance, what materials are needed during construction. Other plans may include visual representations of the construction project that visually communicate to the construction professionals how to assemble or construct the project.

Depending on the type of construction project, these visual representations tend to take one of two different forms. As one possibility, these visual representations may take the form of a set of two-dimensional technical drawings, such as architectural drawings, engineering schematics, or construction blueprints, among others. From these two-dimensional technical drawings, the construction professionals can determine how to construct the project. As another possibility, these visual representations may take the form of a computerized, three-dimensional visual representation of the construction project. Construction professionals can use a corresponding software tool to review the three-dimensional visual representation, often in conjunction with a review of two-dimensional technical drawings, as an aid during the construction process.

In order to facilitate the creation and use of a computerized, three-dimensional model of the construction project, a team of architects, designers, and/or engineers may engage in a process referred to as Building Information Modeling. As a general matter, Building Information Modeling refers to the process of designing and maintaining a computerized representation of physical and functional characteristics of a construction project, such as a building. Specialized software tools can then access this computerized representation and process it to visually communicate how to construct the building via a navigable, three-dimensional model of the building and its infrastructure.

More specifically, but still by way of example, when architects, designers, and/or engineers engage in Building Information Modeling for a specific construction project, they generally produce what is referred to as a Building Information Model (BIM) file. In essence, a BIM file is a computerized description of the individual physical elements that comprise the construction project, such as the physical structure of the building, including walls, floors, and ceilings, as well as the building's infrastructure, including pipes, ducts, conduits, etc. This computerized description can include a vast amount of data describing the individual physical elements of the construction project and the relationships between these individual physical elements, including for instance, the relative size and shape of each element, and an indication of where each element will reside in relation to the other elements in the construction project.

BIM files can exist in one or more proprietary or open-source computer-file formats and are accessible by a range of specialized software tools. One type of specialized software tool that can access BIM files is referred to as a "BIM viewer." A BIM viewer is software that accesses the information contained within a BIM file or a combination of BIM files for a particular construction project and then, based on that file or those files, is configured to cause a computing device to render a three-dimensional view of the computerized representation of the construction project. This view is referred to herein as a "three-dimensional BIM view" or simply a "three-dimensional view."

In order for BIM viewer software to be able to cause a computing device to render a three-dimensional view of the construction project, BIM files typically contain data that describes the attributes of each individual physical element (e.g., the walls, floors, ceilings, pipes, ducts, etc.) of the construction project. For instance, for an air duct designed to run across the first-floor ceiling of a building, a BIM file for this building may contain data describing how wide, how long, how high, and where, in relation to the other individual physical elements of the construction project, the duct is positioned.

There are many ways for BIM files to arrange and store data that describes the attributes of the individual physical elements of a construction project. In one specific example, BIM files may contain data that represents each individual physical component in the construction project (e.g., an air duct) as a mesh of geometric triangles such that when the geometric triangles are visually stitched together by BIM viewer software, the triangles form a mesh, which represents a scaled model of the physical component (e.g., the air duct). In this respect, the BIM file may contain data that represents each triangle of a given mesh as set of coordinates in three-space. For instance, for each triangle stored in the BIM file, the BIM file may contain data describing the coordinates of each vertex of the triangle (e.g., an x-coordinate, a y-coordinate, and a z-coordinate for the first vertex of the triangle; an x-coordinate, a y-coordinate, and a z-coordinate for the second vertex of the triangle; and an x-coordinate, a y-coordinate, and a z-coordinate for the third vertex of the triangle). A given mesh may be comprised of thousands, tens of thousands, or even hundreds of thousands of individual triangles, where each triangle may have a respective set of three vertices and corresponding sets of three-space coordinates for those vertices. However, other ways for a BIM file to contain data that represents each individual physical component in a construction project are possible as well.

Figure 3:
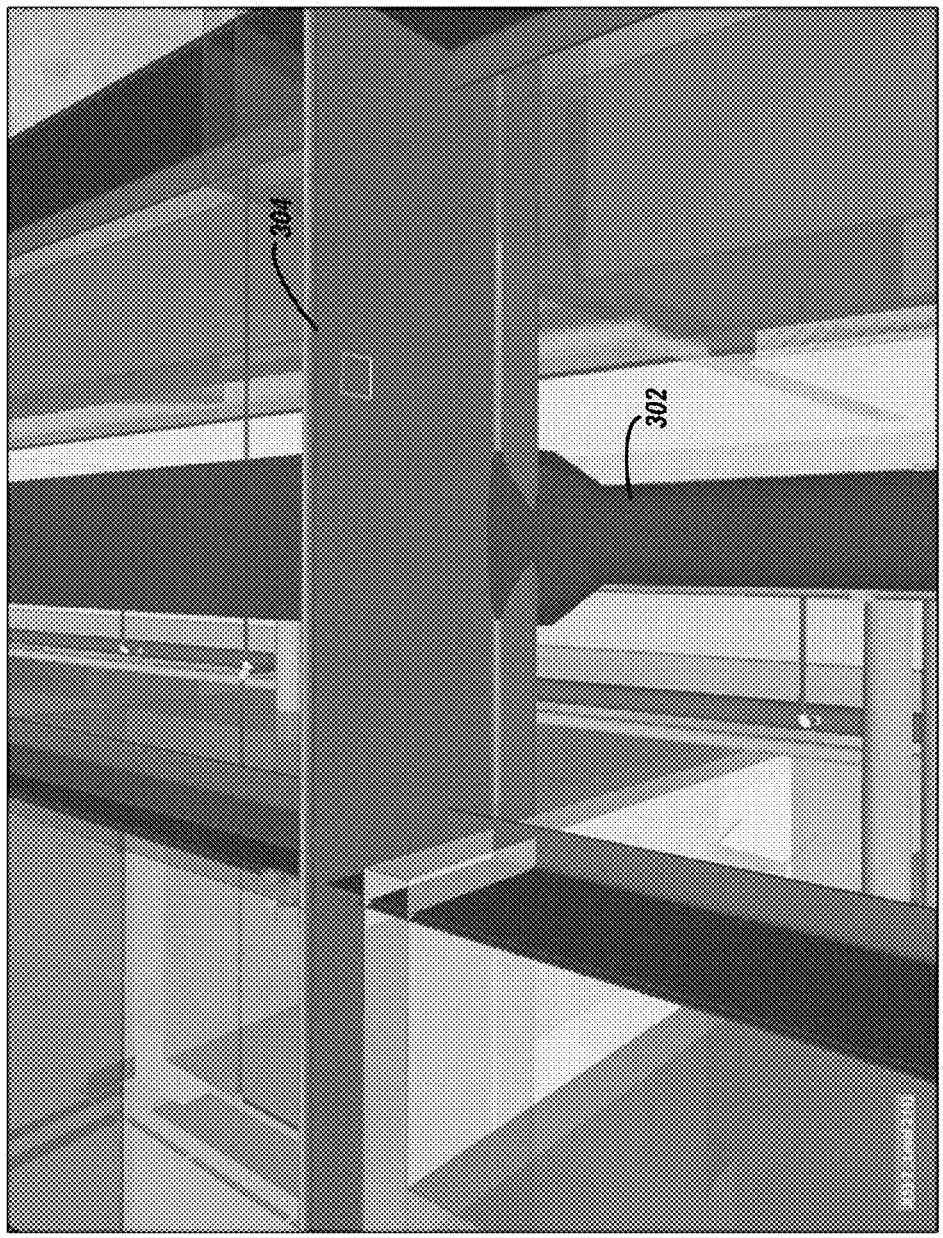
FIG. 3 depicts an example output produced by a device executing one embodiment of a software tool according to the present disclosure.

To illustrate one example of a three-dimensional view, FIG. 3 depicts an example snapshot 300 of a GUI, which includes a three-dimensional view of a construction project rendered at a particular perspective. Snapshot 300 may be generated by, for instance, a software tool running on a client station, such as one of client stations 112 (FIG. 1), accessing a BIM file, and then rendering a three-dimensional view of the construction project based on that BIM file and presenting it via a display interface of that client station. Alternatively, a back-end platform, such as back-end platform 102 (FIG. 1) may access a BIM file and may generate a set of instructions for rendering a three-dimensional view of the construction project based on that BIM file. Back-end platform 102 may then send these instructions to one of client stations 112, which in turn may present a three-dimensional view of the construction project it via a display interface of that client station based on these instructions. Still other arrangements are possible.

Figure 4:
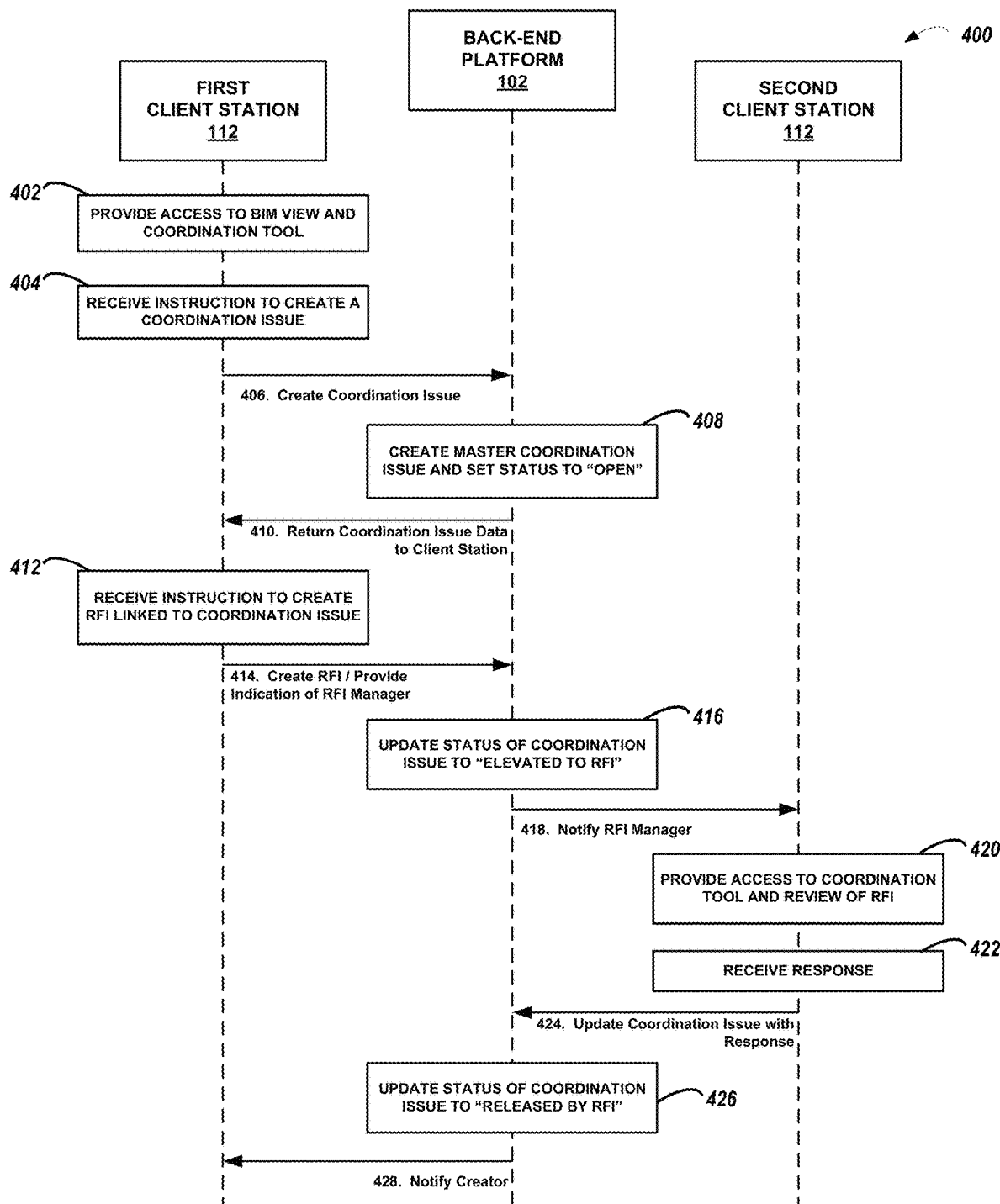
FIG. 4 depicts an example message flow diagram according to the present disclosure.

As depicted, snapshot 300 includes a three-dimensional view of a construction project from a particular perspective. The three-dimensional view depicted in FIG. 3 includes a number of meshes that represent individual physical components of the construction project, such as floors, walls, pipes, and ducts, etc. In particular, depicted in FIG. 4 is, among others, a mesh 302, which represents an air duct, and a mesh 304, which represents a support beam. Of course, in other examples, other meshes are possible as are other layouts and designs of construction projects.

The client station presenting snapshot 300 may be configured to adjust the perspective at which the three-dimensional view is presented in response to, for instance, receiving user inputs at the client station. The client station may do this in various ways. As one possibility, the client station may reposition the perspective either forward or backward along an x-axis of the model in response to receiving a first type of user input via a peripheral, such as pressing the up arrow or down arrow on a keyboard or a click and drag with a mouse. The client station may reposition the perspective laterally along a y-axis of the model in response to receiving a second type of user input via a peripheral, such as pressing the left arrow or right arrow on a keyboard or a different type of click and drag with a mouse. The client station may reposition the perspective either up or down along a z-axis of the model in response to receiving a third type of user input via a peripheral, such as pressing a combination of keys on a keyboard (e.g., the Control key and the up arrow, or the Control key and the down arrow) or yet a different type of click and drag with a mouse. The client station may reposition the orientation of the perspective (i.e., the "camera" angle) in response to receiving a fourth type of user input via a peripheral, such as pressing a combination of keys on a keyboard (e.g., the Alt key and the up arrow, or the Control key and the down arrow) or yet a different type of click and drag with a mouse.

As another possibility, the computing device may reposition the perspective simultaneously along a combination of one or more of the x-axis, the y-axis, and the z-axis of the model in response to receiving a first type of user input at a touch-screen of the computing device, such as a touch and drag gesture made with one finger. The computing device may reposition the orientation of the perspective in response to receiving a second type of user input at a touch-screen of the computing device, such as a touch and drag gesture made with two fingers. However, other examples of adjusting the perspective at which the three-dimensional view is presented are possible as well.

In addition to data describing the individual triangles of a mesh, some BIM files may contain additional data that helps to summarize information relating to the various meshes. For instance, a BIM file may contain, for each mesh, data describing a "bounding box." Conceptually, a bounding box is an imaginary box surrounding the mesh on all sides, with the edges of this box being located at the outermost edges of the mesh. As such, the entire mesh fits inside of this bounding box with no part of the mesh protruding from the bounding box. In this way, the bounding box represents the maximum dimensions of the mesh in rectangular form. BIM viewer software may utilize bounding boxes stored in BIM files in various ways. For instance, it usually takes less storage space to store data describing a bounding box compared to data describing an entire mesh. This is due to the fact that a mesh may comprise of many thousands of triangles in order to accurately represent the mesh's surface, which in some cases is irregular (e.g., the curved surface of a pipe), whereas a bounding box can typically be represented by data describing just eight vertices of a rectangular box. Some BIM viewer software may be configured to operate in a mode designed to conserve processing power and/or storage space in which the BIM viewer software causes a computing device to render just bounding boxes as opposed to rendering the full meshes. By doing so, the BIM viewer software can visually communicate a "low resolution" version of the construction project. Other ways of utilizing bounding boxes, and other ways of containing additional data to help summarize information relating to the various meshes, are possible as well.

BIM files may contain additional data as well, including data describing other attributes of the individual physical elements of the construction project that may or may not be related to the element's specific position in three space. By way of example, this data may include data describing what system or sub-system the component is associated with (e.g., structural, plumbing, HVAC, electrical, etc.), data describing what material or materials the individual physical element is made of; what manufacturer the element comes from; what stage of manufacture the element is in; where the element currently resides (e.g., data indicating that the element is on a truck for delivery to the construction site, and/or once delivered, data indicating where at the construction site the delivered element resides); and/or various identification numbers assigned to the element (e.g., a serial number, part number, model number, tracking number, etc.), as well as others.

Together, these other attributes are generally referred to as metadata. BIM viewer software may utilize this metadata in various ways. For instance, some BIM viewer software may be configured to present different views based on metadata (e.g., displaying all meshes that represent HVAC components but hiding all meshes that represent plumbing components; and/or displaying meshes representing metal components in a certain color and displaying meshes representing wood components in another color, etc.). Alternatively or additionally, BIM viewers can display certain subsets of the metadata based on user input. For example, a user may provide a user input to the BIM viewer software though a click or tap on a GUI portion displaying a given mesh, and in response, the BIM viewer software may cause a GUI to display some or all of the attributes of the physical element represented by the given mesh. Other examples are possible as well.

As mentioned, BIM viewer software is generally deployed on client stations, such as client stations 112 of FIG. 1 (which, as described above, can generally take the form of a desktop computer, a laptop, a tablet, or the like). As such, construction professionals can utilize BIM viewer software during all phases of the construction project and can access a BIM file for a particular construction project in an office setting as well as on the construction site. Accordingly, BIM viewer software assists construction professionals with, among other things, the design and construction of the project and/or to identify issues that may arise during such construction.

IV. Example Operations

As discussed above, BIM files and rendered three-dimensional views based on such BIM files may be used throughout the construction planning process by many different construction professionals in order to provide a visualization of the construction project. The process for creating a BIM file may involve input from various different individuals (or different teams of individuals), who have various different roles with respect to the process of creating the BIM file. For example, a structure team may create a BIM file that models the walls, floors, and ceilings of the construction project, an HVAC team may create another BIM file that models the HVAC equipment and associated ductwork throughout the construction project, and a plumbing team may create yet another BIM file that models the plumbing systems of the construction project.

In practice, another team of individuals—which may be referred to as the virtual design and construction (VDC) team—may then take all of these disparate BIM files and assemble them into a single combined BIM file that reflects the entire construction project. However, after combining the disparate BIM files into the combined BIM file and reviewing the combined BIM file in BIM viewer software, an individual (such as a VDC team member) may identify one or more problems with the combined BIM file, such as an unintended intersection between two meshes, insufficient clearance between two meshes, or meshes that are missing, misshapen, or are otherwise ill-positioned in the construction project, among other examples.

Once a problem with the combined BIM file is identified, the VDC team may then be tasked with developing a plan to rectify such a problem. In this respect, it may be possible for the VDC team to resolve some types of problems itself, without involving other individuals or teams of individuals. For example, a problem identified in the combined BIM file could be the result of a simple error by one of the parties that created the underlying BIM files, in which case the VDC team may be able to rectify such a problem without involving others. However, other types of problems may require the VDC team to get another individual (or team of individuals) involved before the VDC team can rectify the problem. For example, a problem identified in the combined BIM file may require a change to contract documents and/or a change the actual scope of work between the general contractor and the owner of the construction project, in which case the VDC team would typically need to get one or more other individuals (or teams of individuals) involved before the problem can be rectified.

Based on the foregoing, it will be appreciated that rectifying a problem identified in a combined BIM file (or the like) may involve coordination between multiple different parties (where a "party" may be an individual or a team of individuals), which may introduce time delays and other inefficiencies into the process of creating a combined BIM file. For example, once the VDC team notifies the necessary parties about a problem identified in a combined BIM file, the plan for resolving that problem is often slow to make its way back to the VDC team—or worse, fails to reach the VDC team altogether. As a result, the problem originally identified by the VDC team will remain open, potentially blocking work and delaying completion of the construction project.

Moreover, to the extent it exists at all, existing software technology that can be used to communicate problems identified in a combined BIM file (or the like) is limited, and fails to provide for timely, reliable coordination of different parties that are involved in the process of rectifying a problem identified in a combined BIM file.

To address these problems (among others), disclosed herein is software technology that facilitates coordination between various parties that are involved in the process of rectifying a problem identified in a combined three-dimensional model file, such as a BIM file. This software technology—which, as explained above, may be referred to herein as a "coordination tool"—may comprise a front-end portion that may be executed by one or more client stations and a back-end portion that may be executed by a back-end platform. Further, in practice, the front-end portion of the disclosed coordination tool may be integrated into or otherwise interface with a software application for viewing a three-dimensional model of a building, such as a BIM viewer.

To illustrate the features and functionality of the disclosed coordination tool, FIG. 4 depicts an example message flow diagram illustrating an example set of operations in which the disclosed coordination tool may engage, in accordance with one example embodiment. In describing the example set of operations illustrated by flow diagram 400, reference is also made to FIGS. 5-18, which generally depict screenshots from various operational states of one or more embodiments of the disclosed coordination tool, such as software developed by Procore Technologies, Inc. When reference is made to "a coordination tool" or "the coordination tool" engaging in one or more operations, it should be understood that such operations may, in practice, be carried out by one or more computing devices executing one or more instances of the disclosed coordination tool, which in some respects may be embodied as a plug-in to another software tool, or, in other respects, as a web application interface, among other possibilities. In particular, it should be understood that such example operations may be carried out by a computing device, such as computing device 200 (FIG. 2), which as described above, may serve as one or more of client stations 112 (FIG. 1) and/or back-end platform 102 (FIG. 1). In this respect, it should be further understood that, depending on the implementation, the operations discussed herein below may be carried out entirely by a single computing device, such as one or more of client stations 112 or by back-end platform 102, or may be carried out by a combination of computing devices, with some operations being carried out by back-end platform 102 (such as computational processes and data-access operations) and other operations being carried out by one or more of client stations 112 (such as display operations and operations that receive user inputs). However, other arrangements are possible as well.

Figure 5:
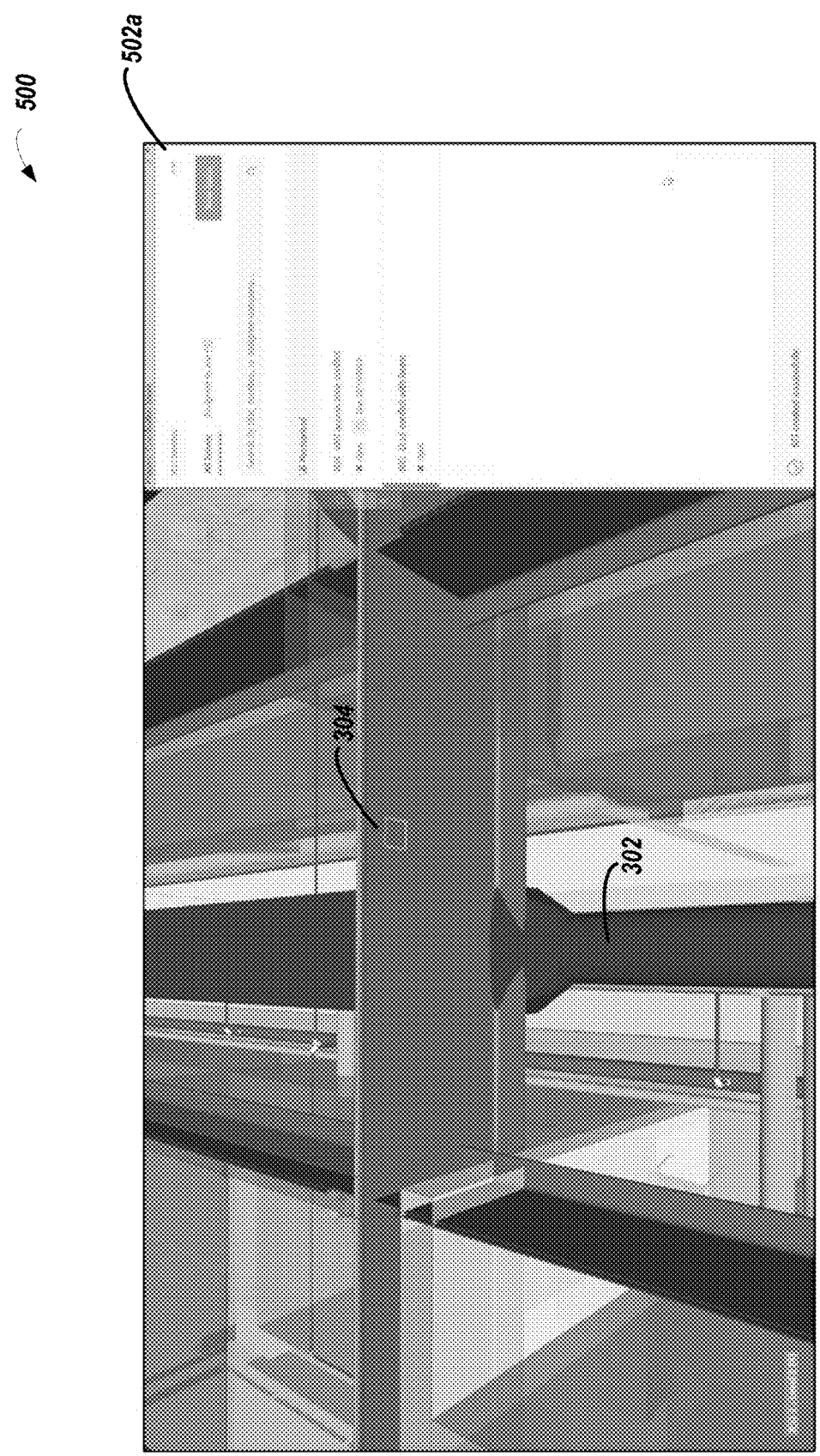
FIG. 5 depicts an example output produced by a device executing one embodiment of a software tool according to the present disclosure.
Figure 6:
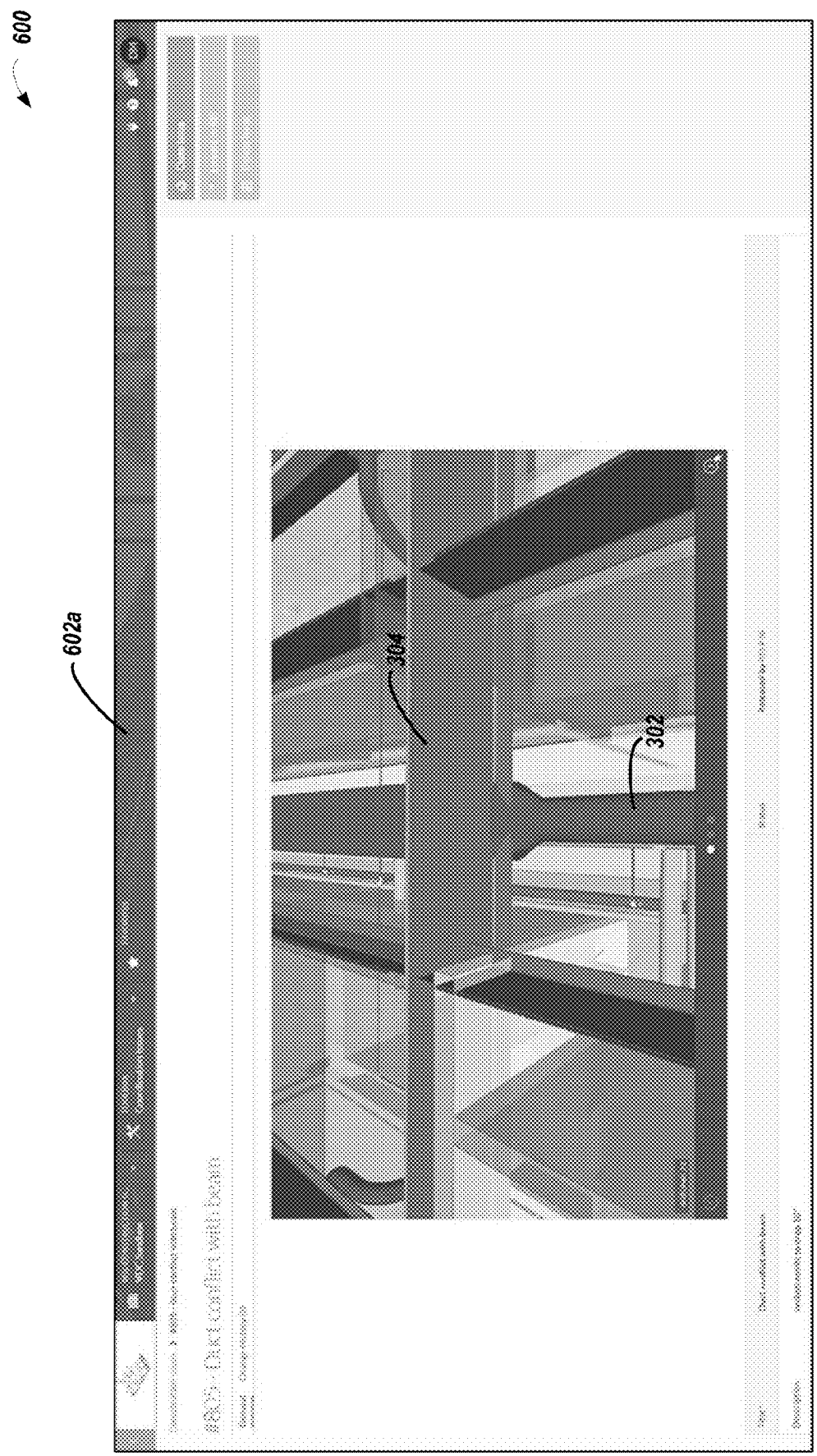
FIG. 6 depicts an example output produced by a device executing one embodiment of a software tool according to the present disclosure.

Turning first to block 402 in FIG. 4, a first client station 112 (which may be executing a front-end portion of the disclosed coordination tool) may provide access to a three-dimensional BIM view and the coordination tool. The first client station 112 may do this in a number of ways. As one possibility, the first client station may present the coordination tool in the form of a plug-in to BIM viewer software, one implementation of which is depicted in FIG. 5. Specifically, FIG. 5 depicts an example snapshot 500 of a GUI, which includes a three-dimensional view of a construction project rendered at a particular perspective and a first screen 502a of a coordination issues plugin shown at the right-hand side of FIG. 5. As another possibility, the first client station 112 may present the coordination tool in the form of a web application, one implementation of which is depicted in FIG. 6. Specifically, FIG. 6 depicts an example snapshot 600 of a GUI, which includes a first screen 602a of web application interface. In this implementation, the web application interface may also optionally include a plugin that may enable a user to view and navigate a full three-dimensional BIM view or two-dimensional screenshots of the three-dimensional BIM view. The disclosed coordination tool may take other forms, and the first client station may provide access to the disclosed coordination tool and a three-dimensional BIM view in other ways as well.

As depicted in FIG. 5, the first client station may display a three-dimensional view of a construction project within BIM viewer software, which may allow a user to navigate and view different portions of the construction project. By navigating through the three-dimensional view, a problem in the BIM file may become evident. In one illustrative example of this, if a ceiling mesh is not positioned high enough to accommodate a duct mesh, the duct mesh may be shown in a three-dimensional view thereof as protruding through a support structure mesh. As FIG. 5 depicts, air duct mesh 302 is shown protruding through beam mesh 304. Other examples of problems in a BIM file or files are possible as well.

Returning to FIG. 4, at block 404 the first client station 112 may receive an instruction to create a Coordination Issue, such as by way of a click or a tap on a respective button displayed on a GUI. As a general matter, a Coordination Issue is a data structure that contains an indication that some aspect of the construction project may need to be addressed, as well as perhaps other information, such as the party responsible for addressing the aspect, a due date, and a location, among other kinds of information. Typically, Coordination Issues arise during the planning phase of a construction project, and most particularly as the result of discovering an anomaly or other problem with the plans for the construction project, such as an anomaly or other problem that may be evident in a two-dimensional technical drawing and/or a three-dimensional BIM view. For instance, as mentioned above, one problem that may evident in a three-dimensional BIM view is that a portion of a first mesh may be shown as protruding through a portion of a second mesh. However, Coordination Issues may arise as a result of discovering an anomaly or other problem with aspects of a construction project during other phases of the construction project as well.

In response to receiving an instruction to create a Coordination Issue, the first client station 112 may receive indications of various kinds of data to associate with the Coordination Issue. As one possibility, the first client station 112 may capture a screenshot of the three-dimensional BIM view at or near the time when the first client station 112 received the instruction to create the Coordination Issue. In this respect, the first client station 112 may also provide the ability for the user to navigate through the three-dimensional BIM view and capture additional screenshots to associate with the Coordination Issue.

Figure 7:
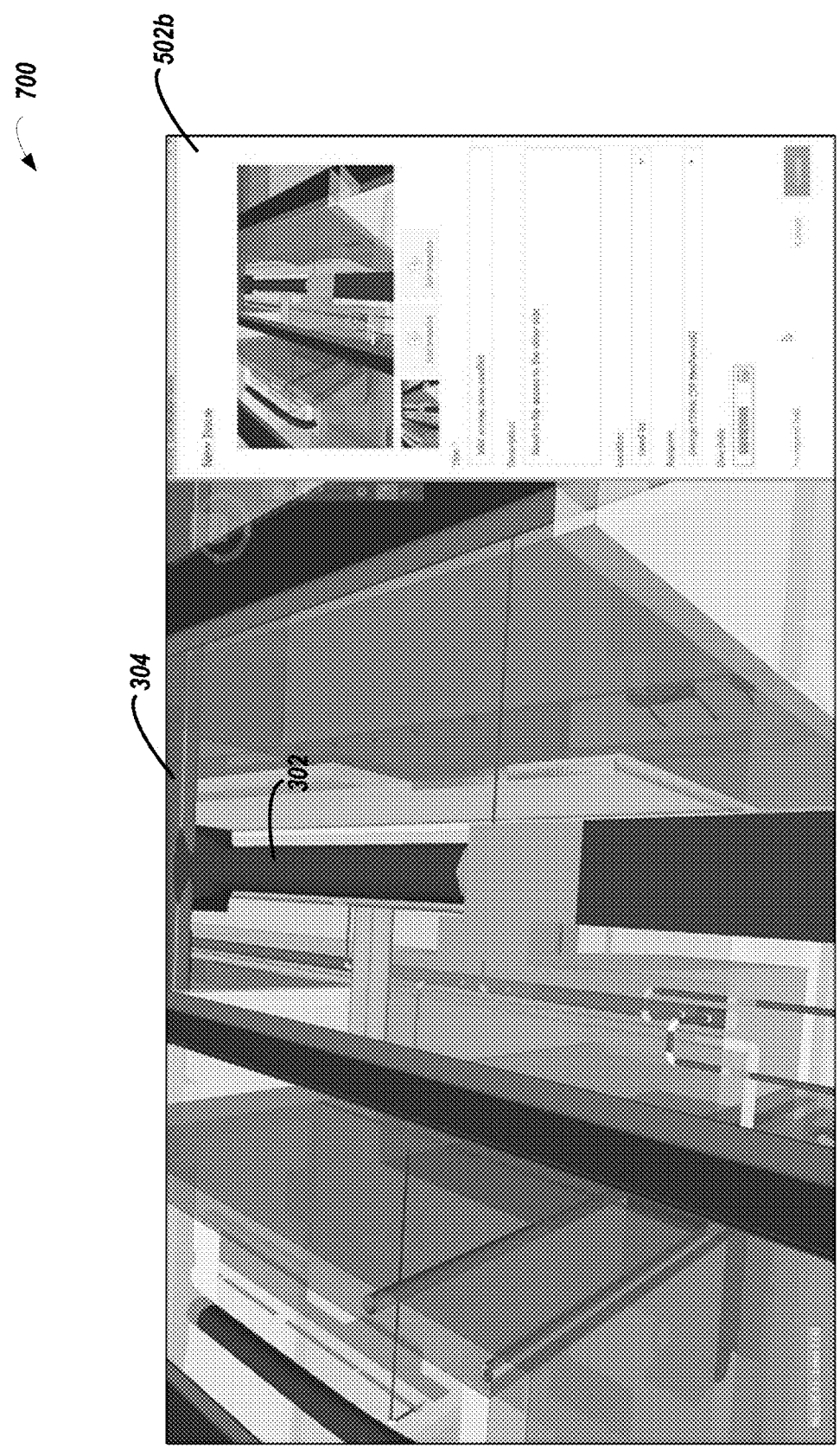
FIG. 7 depicts an example output produced by a device executing one embodiment of a software tool according to the present disclosure.

As another possibility, the first client station 112 may display one or more fields at which a user may provide additional data to associate with the Coordination Issue. To illustrate one example of this, FIG. 7 depicts an example snapshot 700 of a GUI that includes a second screen 502b of the coordination issues plugin. This second screen 502b of the coordination issues plugin may include additional fields, such as a title of the Coordination Issue, a description of the Coordination Issue, a location of the Coordination Issue, an assignee of the Coordination Issue, and a date by which the Coordination Issue should be resolved, among other possibilities. In some screens, the location may indicate the specific floor of the building where the Coordination Issue occurs. In some implementations, the first client station 112 may pre-populate a list of options for an assignee of the Coordination Issue. In this respect, the first client station 112 may retrieve from the back-end platform 102, and/or a database communicatively coupled thereto, the names, roles, and other data pertaining to a set of relevant individuals, and populate this data into a list from which a user at first client station 112 may select. The first client station 112 may display additional fields as well.

After receiving the foregoing information, the first client station 112 executing the front-end portion of the disclosed coordination tool may receive an input indicating that the Coordination Issue should be saved. In some implementations, a user may provide such an input to the first client station 112 by, for instance, clicking or tapping a button on a GUI. Returning to FIG. 4, the first client station 112 may at this point send to back-end platform 102 a request 406 to create and save the Coordination Issue. The first client station 112 may include with this request some or all of the data first client station 112 received as set forth above, including one or more screenshots of the three-dimensional BIM view, a title of the Coordination Issue, a description of the Coordination Issue, a location of the Coordination Issue, an assignee of the Coordination Issue, and/or a date by which the Coordination Issue should be resolved, among other possibilities.

Back-end platform 102 may then, at block 408, create and store a master copy of the Coordination Issue as well as set a status of the Coordination Issue to "open." As mentioned above, Coordination Issues may have an associated status. For example, when a Coordination Issue is first created by the back-end platform 102, the status associated with this Coordination Issue may be set to "open." A Coordination Issue may have other possible statuses, as may be described further herein.

Upon creation of the Coordination Issue, back-end platform 102 may optionally send an assignee of the Coordination Issue a notification (via email, in-app notification, or in some other manner) that there is a Coordination Issue that needs to be addressed. After the Coordination Issue has been created, a user (such as the creator of the Coordination Issue or the assignee) may then access a front-end portion of the disclosed coordination tool via a client station (such as second client station 112) in order to review, and perhaps modify, the Coordination Issue.

Continuing at FIG. 4, after creation, the back-end platform 102 may at step 410 return to the first client station 112 Coordination Issue data, which may include for instance an indication that the Coordination Issue has been created and its status is set to "open." A user at the first client station 112 may then review and perhaps modify the Coordination Issue. After reviewing the Coordination Issue, the creator may determine that the Coordination Issue is one that needs to be further addressed by a different part of the construction team, such as a general contractor or the design team. To facilitate this, the disclosed coordination tool may be configured to receive an indication that a particular Coordination Issue should be elevated to an RFI. As a general matter, an RFI is an additional data structure that contains an indication that a previously-identified Coordination Issue is unable to be immediately rectified (by, for example the VDC team) and the input of one or more additional parties is requested. As mentioned, an RFI is generally linked to a particular Coordination Issue and an RFI may include in its data structure other information, such as the party or parties responsible for addressing the RFI, a due date, a location, and/or comments, among other kinds of information. Although a single RFI is typically linked to just one Coordination Issue (with a single Coordination Issue having one or more RFIs linked thereto), it may be possible for an RFI to be linked to multiple Coordination Issues.

Returning to FIG. 4, at block 412 the first client station 112 may receive an instruction to create an RFI linked to the Coordination Issue. Although this step is depicted in FIG. 4 and described below as taking place at the first client station 112, it should be understood that this step may take place at a different client station, such as second client station 112.

Figure 8:
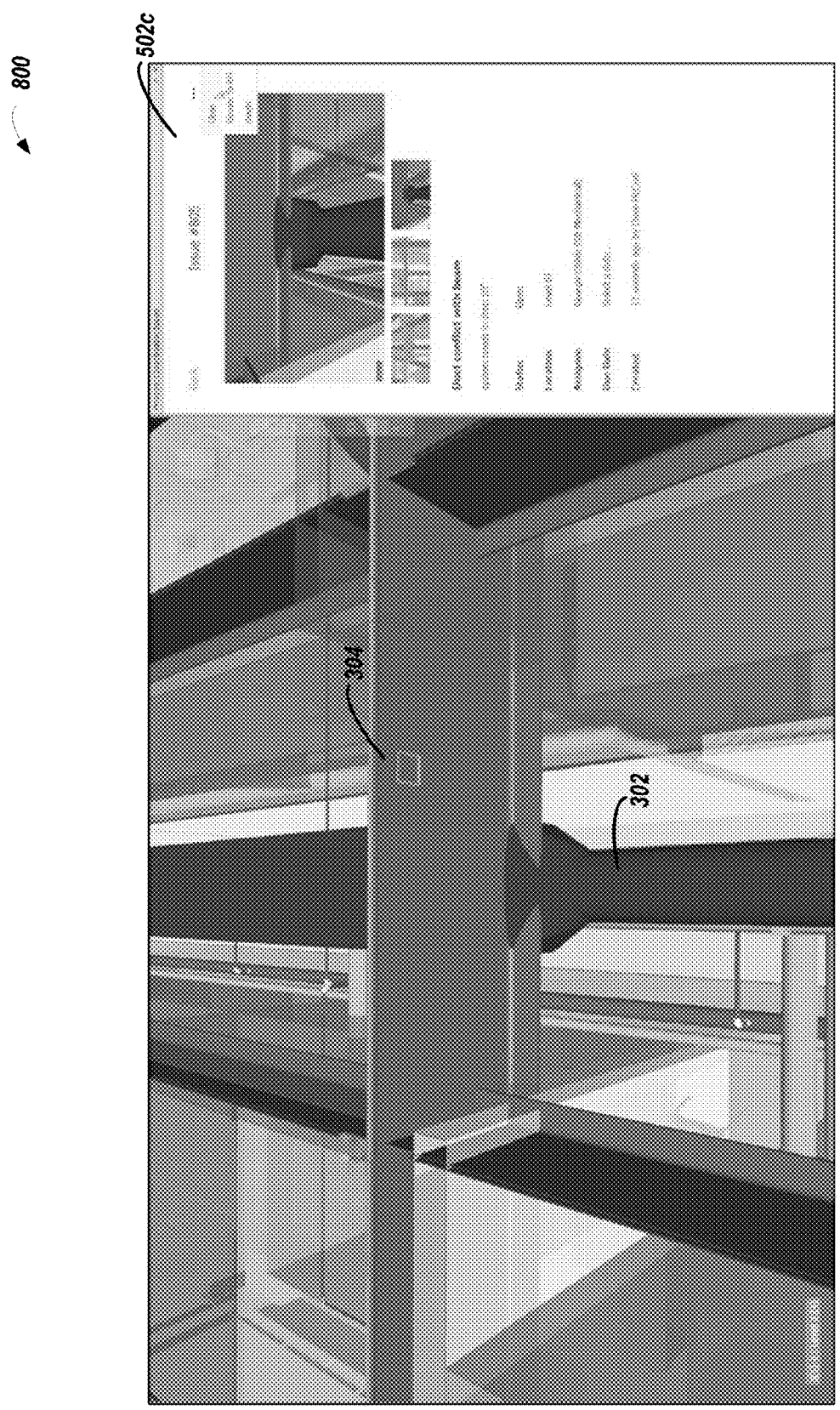
FIG. 8 depicts an example output produced by a device executing one embodiment of a software tool according to the present disclosure.

To help illustrate the RFI creation process, FIG. 8 depicts an example snapshot 800 of a GUI, which includes a three-dimensional view of a construction project rendered at a particular perspective and a third screen 502c of the coordination issues plugin shown at the right-hand side of FIG. 8. In this example, the user may operate the disclosed coordination tool, by clicking through a drop-down menu, to elevate the Coordination Issue to a "draft RFI." A "draft RFI" in this context means that an RFI manager or other party to whom the RFI has been assigned (which is referred to herein in some embodiments as an "assignee") has not yet submitted the RFI to any other party (such as a design team or the like) for input.

Figure 9:
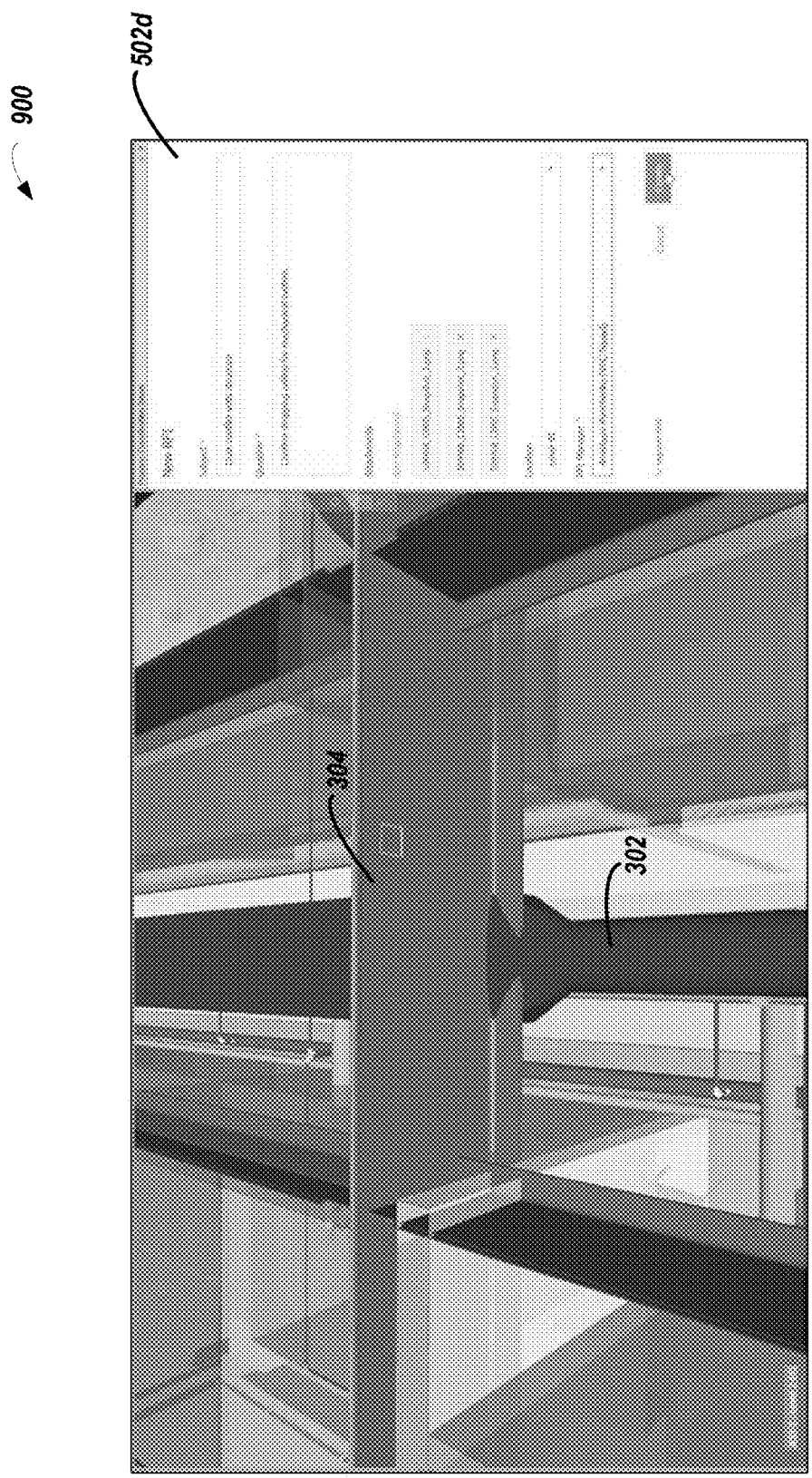
FIG. 9 depicts an example output produced by a device executing one embodiment of a software tool according to the present disclosure.
Figure 10:
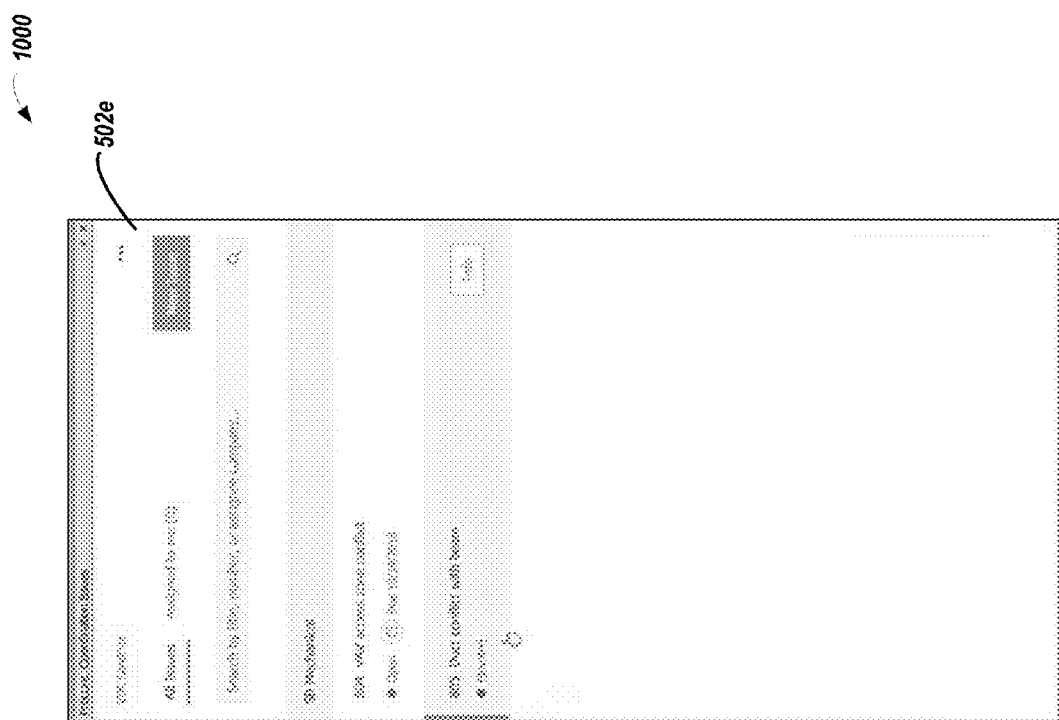
FIG. 10 depicts an example output produced by a device executing one embodiment of a software tool according to the present disclosure.

If the client station receives an indication that a particular Coordination Issue should be elevated to an RFI, then, as shown in FIG. 8, the client station may, in response to receiving such an indication, present certain fields that allow the user to input additional information to associate with the draft RFI. FIG. 9 depicts an example snapshot 900 of a GUI, which includes a three-dimensional view of a construction project rendered at a particular perspective and a fourth screen 502d of the coordination issues plugin, shown at the right-hand side of FIG. 9, that presents certain fields that allow the user to input additional information pertaining to the draft RFI. In addition, the first client station 112 may include, as a part of the RFI submission, the relevant snapshots of the Coordination Issue from the three-dimensional view of the construction project as well as, perhaps, other location information. Further, the first client station 112 may allow the user to select an RFI manager from a list of RFI managers, which, in a similar manner to that mentioned above with respect to block 404, may be populated by the first client station 112 as a result of accessing and querying the back-end platform or one or more databases.

After the user inputs the foregoing information and confirms, the first client station may interact with the back-end platform, such as by sending to the back-end platform 102 a request 414 to create the RFI, which may include any additional information collected as set forth above, including an indication of the RFI manager. Responsively, back-end platform 102 may, at block 416, create the RFI, link the RFI to the Coordination Issue, and update the status of the Coordination Issue to "Elevated to Draft RFI" (or "Elevated," for short). An example of this is reflected in FIG. 10, which depicts an example snapshot 1000 that includes a fifth screen 502e of the coordination issues plugin. As depicted, the fifth screen 502e of the coordination issues plugin may include a listing of example Coordination Issues that have been created via the disclosed coordination tool.

Figure 11:
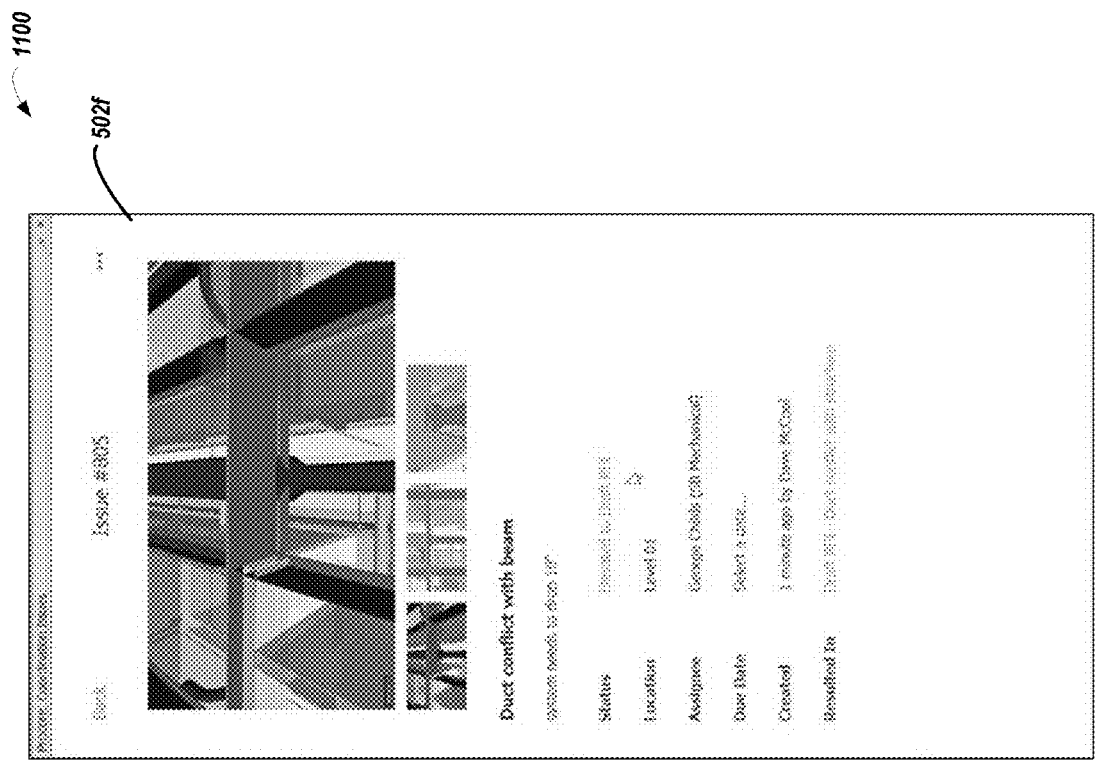
FIG. 11 depicts an example output produced by a device executing one embodiment of a software tool according to the present disclosure.
Figure 12:
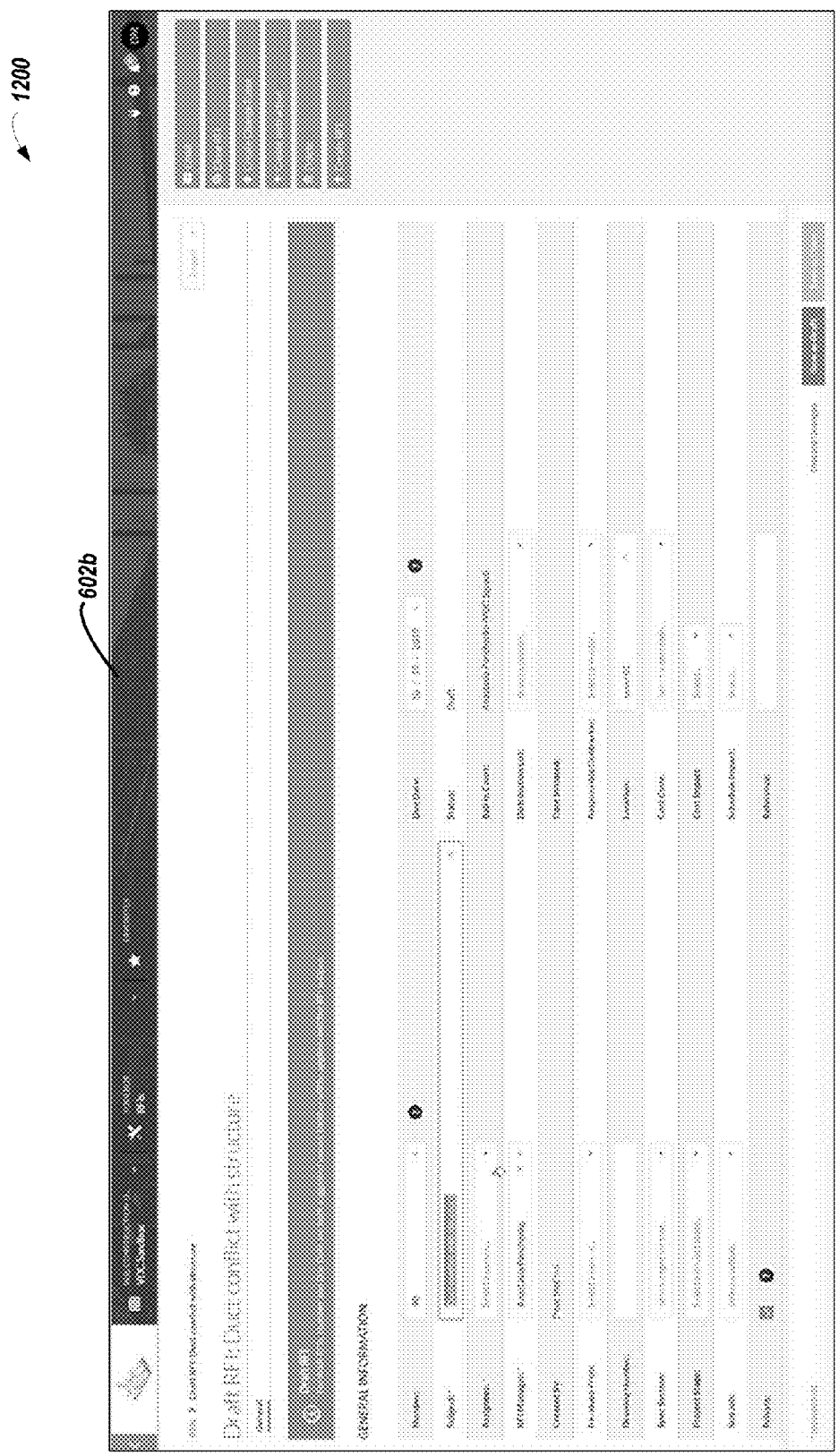
FIG. 12 depicts an example output produced by a device executing one embodiment of a software tool according to the present disclosure.

In some implementations, if a client station receives a user input selecting one of the Coordination Issues listed in, for example, the fifth screen 502e of the coordination issues plugin, then the client station may provide further information regarding the selected Coordination Issue. To illustrate, FIG. 11 depicts an example snapshot 1100 that includes a sixth screen 502f of the coordination issues plugin, which provides further information of an example Coordination Issue "#805," including its current status. In practice, other ways of accessing further information regarding a particular Coordination Issue may be possible as well.

Once a draft RFI is created, the first client station may allow a user to access the draft RFI via the disclosed coordination tool in order to review the draft RFI. The draft RFI may be accessed in various manners, including, in the representative example depicted in FIG. 11, by clicking or tapping the text "Draft RFI—Duct conflict with structure." Other ways of accessing the draft RFI are possible as well. For instance, responsive to receiving a user input requesting to access the draft RFI, such as by selecting the example text in the representative example depicted in FIG. 11, the back-end platform 102 may cause the a client station, such as first client station 112, to provide access to the coordination tool, which may allow a user to review the draft RFI. This access may take various forms. For instance, as one possibility, the first client station 112 may present a second screen 602b of the web application interface depicted in snapshot 1200 of FIG. 12. As depicted, the second screen 602b of the web application interface is configured such that a user can interact with the draft RFI that is linked to the Coordination Issue. The user may operate the second screen 602b of the web application interface to add or modify certain information for the draft RFI (e.g., assign one or more assignees who may work for a design team, assign or reassign an additional RFI Manager, add a drawing number, assign a location, and specify a due date, among other possibilities) and then save the draft RFI as an "open" RFI. In response to receiving an indication from the user to save the RFI as an open RFI, the client station may communicate this indication to the back-end platform, which may in turn assign an identifier (e.g., a unique number) to the RFI.

Returning to FIG. 4, back-end platform 102 may at this point send a notification 418 to the RFI manager to indicate to the RFI manager that there is an RFI that needs to be addressed. For instance, in some implementations, notification 418 may take the form of an email, in-app notification, and/or SMS message, among other possibilities, and may be sent to a client station associated with the RFI manager, such as second client station 112. However, in other implementations, an RFI manager, or any other user, may access the open RFI via the disclosed coordination tool without having first received a notification.

Figure 13:
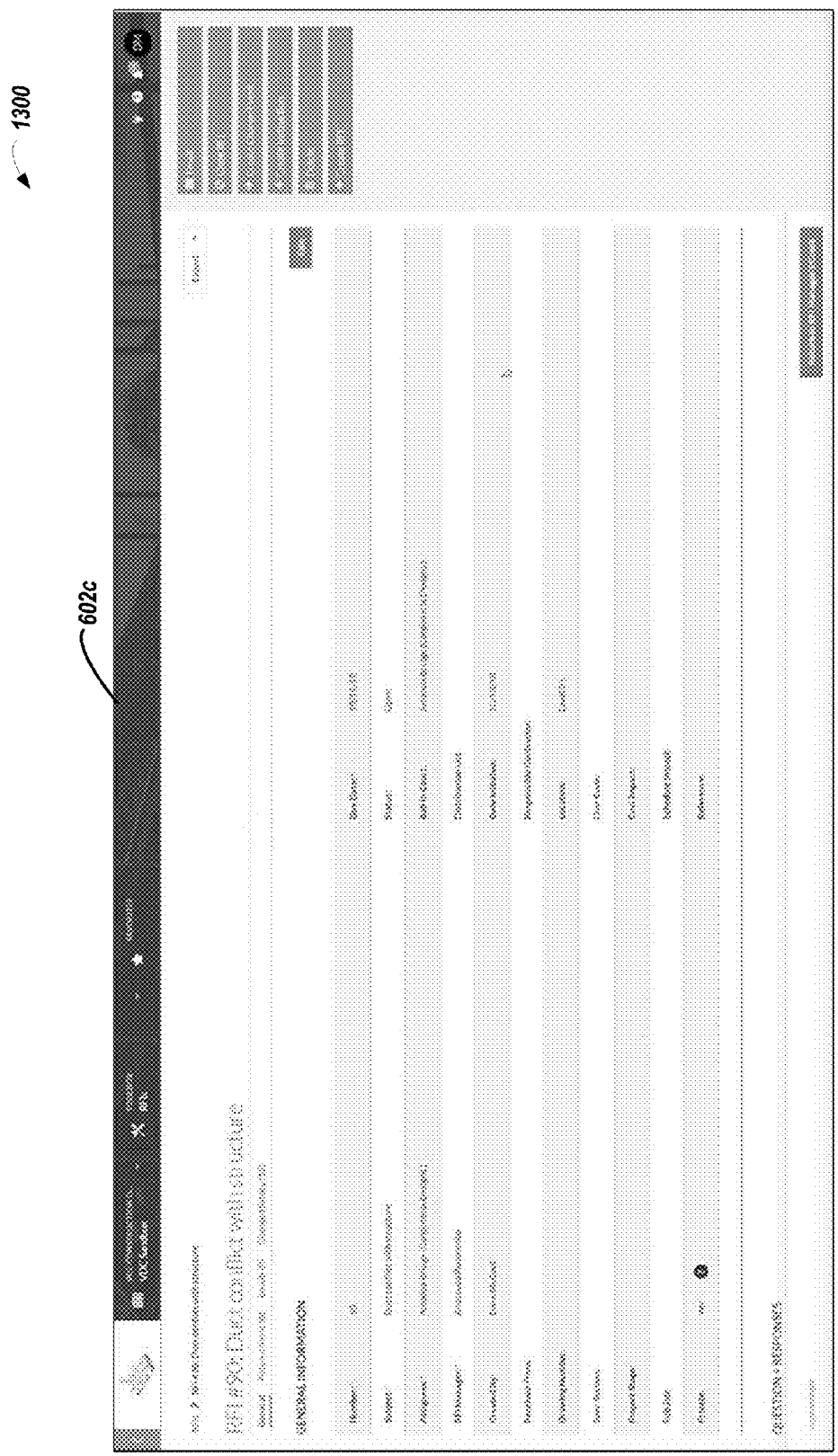
FIG. 13 depicts an example output produced by a device executing one embodiment of a software tool according to the present disclosure.
Figure 14:
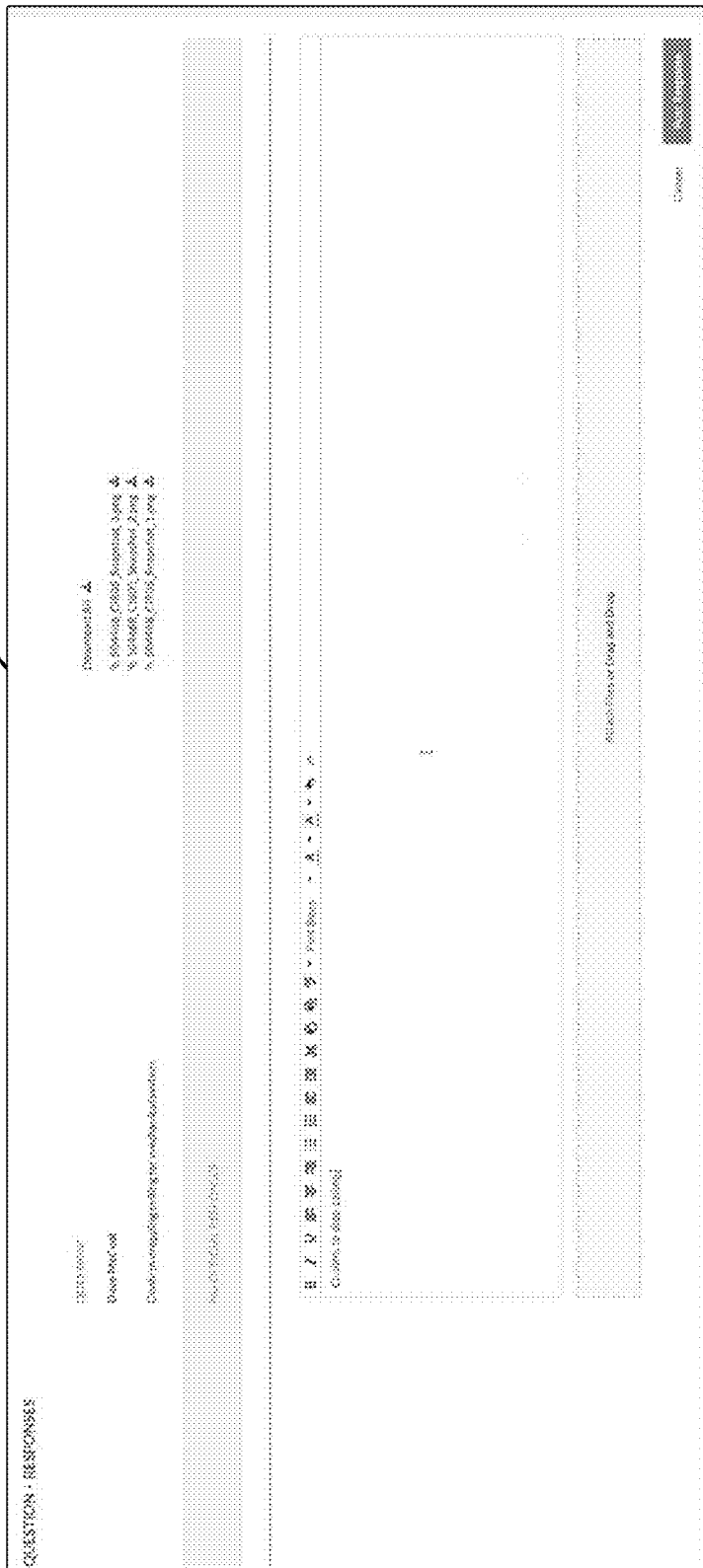
FIG. 14 depicts an example output produced by a device executing one embodiment of a software tool according to the present disclosure.
Figure 15:
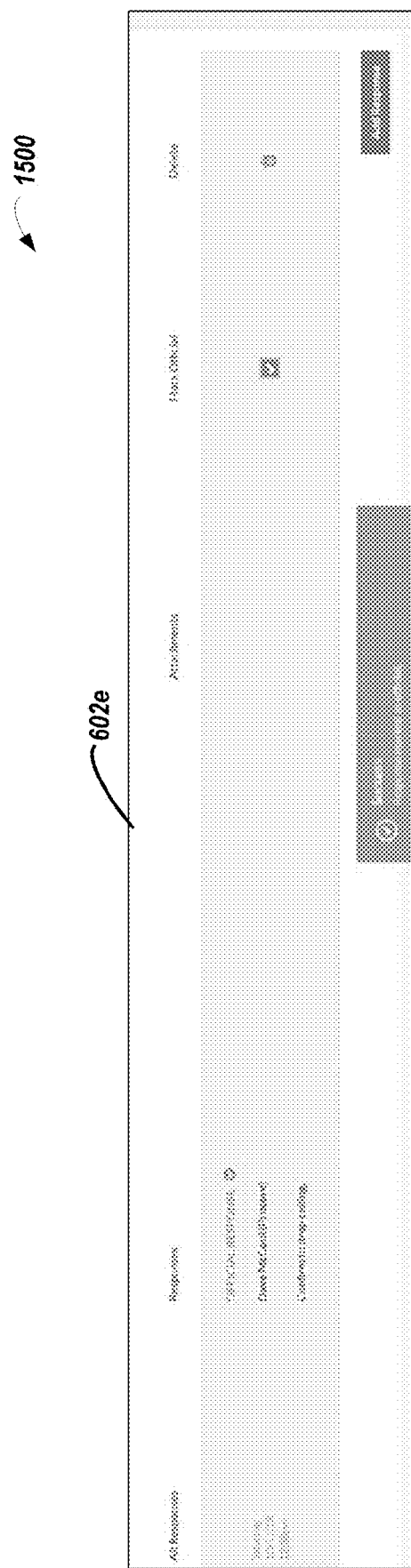
FIG. 15 depicts an example output produced by a device executing one embodiment of a software tool according to the present disclosure.

To illustrate one example of accessing an open RFI, FIG. 13 depicts an example snapshot 1300 that includes a third screen 602c of the web application interface. This third screen 602c depicts an example view of certain RFI information after the corresponding RFI has been saved. To further illustrate, FIGS. 14-15 depict additional snapshots 1400 and 1500 that include additional screens 602d and 602e, respectively, of the web application interface provided by the disclosed coordination tool. These additional screens of the web application interface may facilitate RFI manager review of an Open RFI. For instance, as depicted in FIG. 14, screen 602d of the disclosed coordination tool allows the assignee to review the RFI, add comments, and close the RFI by providing an indication that the Coordination Issue is now in the "official response" stage, which causes the RFI to be marked as closed. And as depicted in FIG. 15, screen 602e of the disclosed coordination tool allows the assignee to confirm the response provided, for example, via screen 602d (FIG. 14) and mark it "official." This is represented in FIG. 4 at block 422 where the second client station 112 receives a response for the RFI.

In response to either or both of (1) receiving the response from the RFI manager or other user or (2) receiving an indication that the RFI was marked as complete, second client station 112 may provide back-end platform 102 with a update message 424 informing back-end platform 102 of the response or that the RFI was marked complete. Responsively, back-end platform may, at block 426, update information associated with the Coordination Issue to reflect this change. For instance, back-end platform may change the status of the Coordination Issue to "Released by RFI."

Further, the back-end platform may, in some implementations, alert one or more users associated with the Coordination Issue of the status change, such as, in the example presented herein, by sending a notification 428 to first client station 112. In this example, the back-end platform 102 may provide notification 428 to the creator of the Coordination Issue (via first client station 112), and may also provide a similar notification to an assignee of the Coordination Issue and/or any other users that has been associated with the Coordination Issue. In some examples, notification 428 may take the form of an email; however, in other examples, other alert types are possible, such as an in-app notification, an SMS message, etc.

Figure 16:
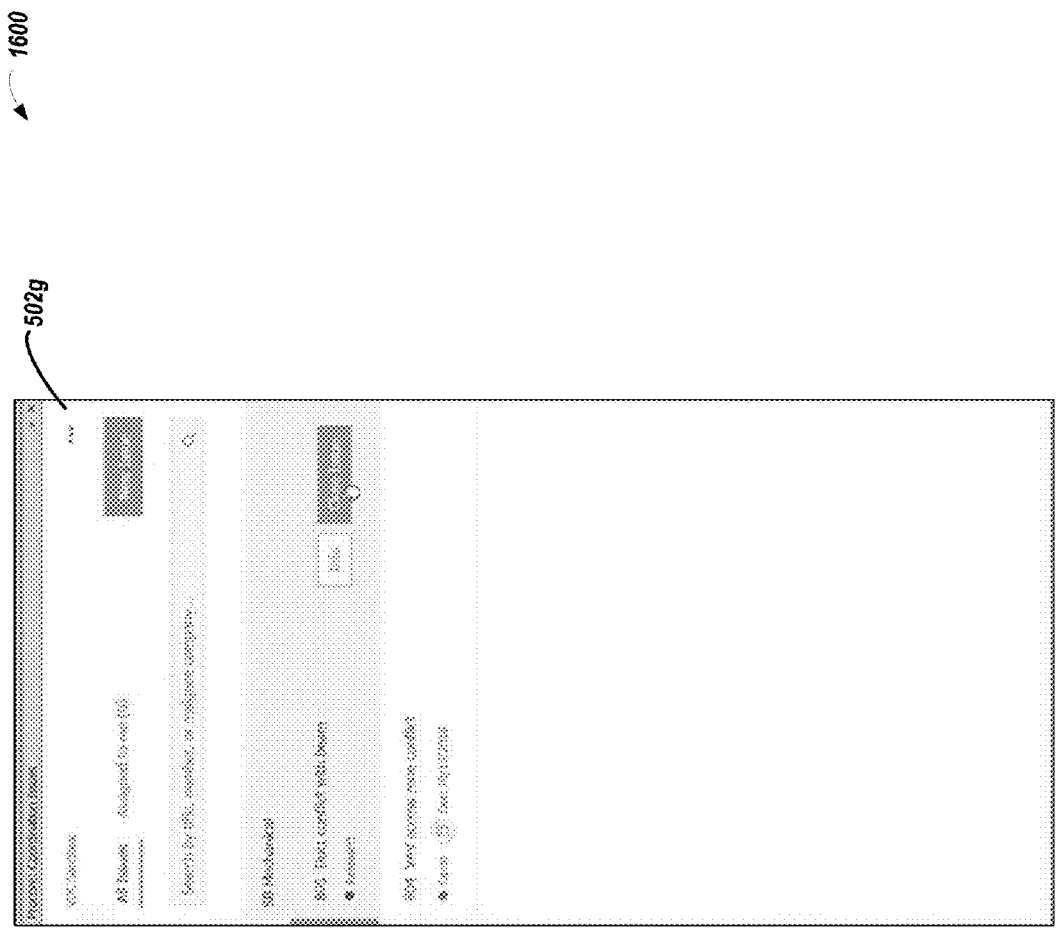
FIG. 16 depicts an example output produced by a device executing one embodiment of a software tool according to the present disclosure.
Figure 17:
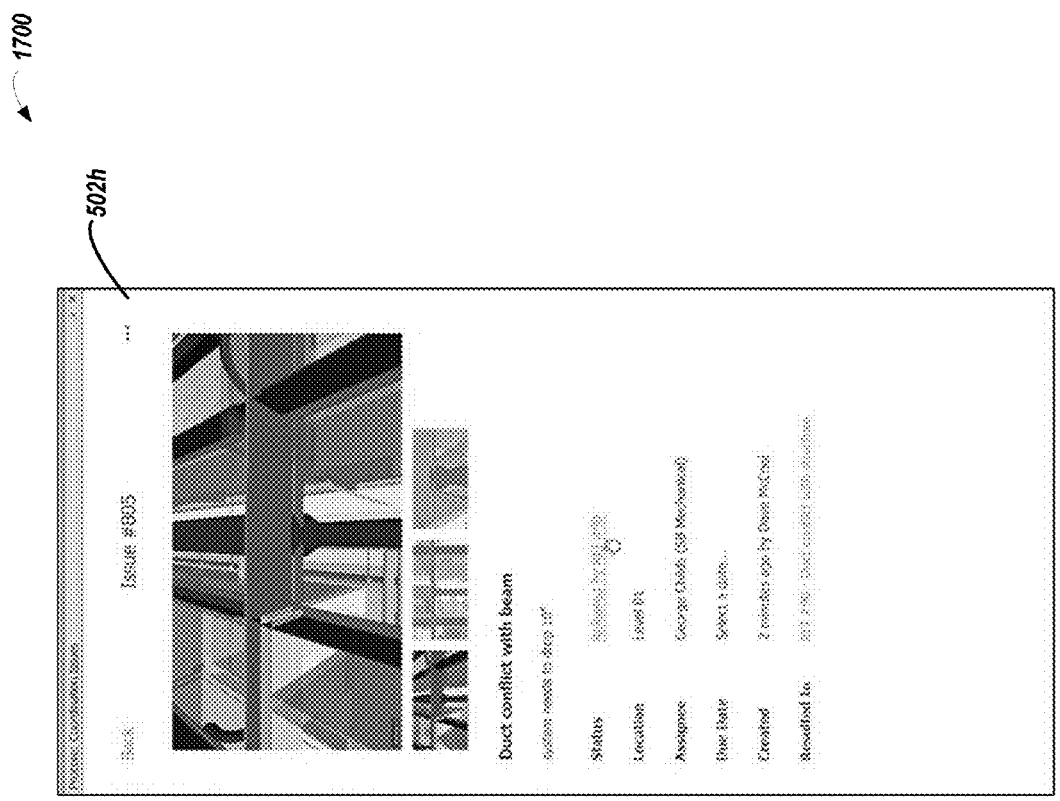
FIG. 17 depicts an example output produced by a device executing one embodiment of a software tool according to the present disclosure.

FIG. 16 depicts a snapshot 1600 of a seventh screen 502g of the coordination issues plugin, which shows a list of outstanding Coordination Issues. As shown, this screen 502g allows a user to navigate between "All Issues" and issues "Assigned to me." If the user has appropriate privileges, the user may provide a user input requesting to close one or more Coordination Issues that have been released, such as by clicking or tapping on a "Close Issue" button. In addition, some users may have review privileges, and when upon completing the review of a Coordination Issue, such users may provide a user input indicating that the review is complete. Responsive to receiving such an indication via the user's client station, the back-end platform may send to a manager an indication that review of the Coordination Issue is complete, and the manager may then have the ability to close the Coordination Issue at that point.

Similar to the functionality discussed above with respect to FIG. 10, a user may also provide a user input requesting more information regarding a Coordination Issue or an RFI associated therewith by, for example, clicking or tapping on an "Info" button associated with a particular Coordination Issue. For example, tapping or clicking on the "Info" button associated with Coordination Issue "805 Duct conflict with beam" may bring up a screen resembling screen 502h of the coordination issues plugin depicted in snapshot 1700 of FIG. 17. As depicted by screen 502h, the status of the Coordination Issue "805 Duct conflict with beam" indicates that it is "Released by RFI #90." Screen 502h may provide one or more embedded links, through which the user may access additional information regarding the Coordination Issue or an RFI associated therewith. For example, in screen 502h, the user may click or tap on "Released by RFI #90" to view information associated with RFI #90 and the official response from the RFI assignee (not shown).

Figure 18:
FIG. 18 depicts an example output produced by a device executing one embodiment of a software tool according to the present disclosure.

FIG. 18 depicts a snapshot 1800 of an additional screen 602f of the web application interface for the disclosed coordination tool. As depicted, screen 602f provides various visualizations of all of the Coordination Issues for a particular a construction project. These visualizations may provide a construction professional with an improved understanding of how the coordination process is progressing for the construction project. As shown in FIG. 18, screen 602f may include an Overview chart 1802, a Progress chart 1804, and a Ball in Court chart 1806. Screen 602f may also include a listing 1808 of all Coordination Issues associated with the construction project, through which the user can browse and open various additional screens to access additional information for a given Coordination Issue, as desired. In order to generate the various visualizations 1802, 1804, 1806, the back-end platform may aggregate certain information fields from the various Coordination Issues in the construction project, including for instance, (1) a "Status" field, which may have various values including "Open," "Closed," "Ready for Review," Elevated," or "Released," among others; (2) a "Location" field, which may have various values including "Roof," "Level 04," "Level 03," "Level 02," "Level 01," "Level 00," and "New Location," among others; and/or (3) a "Ball in Court" field, which may use the names of certain construction professionals or the names of certain teams of construction professionals. Other fields and other values are possible as well.

Progress chart 1804 may provide a visual representation of how the coordination process is proceeding level-by-level, which in turn may provide an understanding of where the focus of work is being done (and how close to the start of construction a product may be). For example, as shown in the example progress chart 1804 of FIG. 18, there are significant Coordination Issues for "Level 01," but not much has been found (or done) for the "Roof." In addition, the Progress chart 1804 may identify the status of the Coordination Issue via the differently-colored bands. In response to receiving a user input selecting any of these statuses (e.g., by a click or a tap) the coordination tool may filter the listing 1808 of Coordination Issues, allowing a user to more easily find, select, and access additional about, certain Coordination Issues.

It should be understood that the foregoing workflow for managing a Coordination Issue may take various other forms as well—including the possibility that some functions described above as being carried out by the back-end platform may alternatively be carried out by a client station (or vice versa), among other variations.

V. Conclusion

Example embodiments of the disclosed innovations have been described above. Those skilled in the art will understand, however, that changes and modifications may be made to the embodiments described without departing from the true scope and sprit of the present invention, which will be defined by the claims.

For instance, those in the art will understand that the disclosed workflows for creating and managing Coordination Issues may be implemented in other construction-related areas. The disclosed approaches creating and managing Coordination Issues could be used in other contexts as well.

Further, to the extent that examples described herein involve operations performed or initiated by actors, such as "humans," "operators," "users" or other entities, this is for purposes of example and explanation only. The claims should not be construed as requiring action by such actors unless explicitly recited in the claim language.

We claim:

1. A computing system comprising:
at least one processor;
a non-transitory computer-readable medium; and
program instructions stored on the non-transitory computer-readable medium that are executable by the at least one processor to cause the computing system to:
render a three-dimensional view of a construction project;
display the rendered three-dimensional view of the construction project on a graphical user interface;
while displaying the rendered three-dimensional view of the construction project, receive, via the graphical user interface, an indication requesting creation of a coordination issue that relates to a portion of the rendered three-dimensional view of the construction project;
in response to the receipt of the indication, create a data set defining the coordination issue, the data set including (i) a representation of the portion of the rendered three-dimensional view, and (ii) data indicating an assignee of the coordination issue; and
cause an indication of the coordination issue to be presented to a client station associated with the assignee.

2. The computing system of claim 1, wherein the computing system further comprises program instructions that are executable by the at least one processor to cause the computing system to:
create the data set defining the coordination issue by capturing a screenshot of at least the portion of the rendered three-dimensional view of the construction project and including the screenshot within the data set defining the coordination issue.

3. The computing system of claim 1, wherein the program instructions executable to cause the computing system to cause an indication of the coordination issue to be presented to a client station associated with the assignee comprise program instructions that are executable by the at least one processor to cause the computing system to:
send to a back-end platform the data set defining the coordination issue; and
cause the back-end platform to send to a client station associated with the assignee a notification of the coordination issue.

4. The computing system of claim 1, wherein the computing system further comprises program instructions that are executable by the at least one processor to cause the computing system to:
present a summary of at least a portion of the data set defining the coordination issue; and
cause remote client stations to present respective summaries of at least a portion of the data set defining the coordination issue.

5. The computing device system of claim 4, wherein the program instructions executable to cause the computing system to cause remote client stations to present respective summaries of at least a portion of the data set defining the coordination issue comprise program instructions that are executable by the at least one processor to cause the computing system to:
send to a back-end platform the data set defining the coordination issue, such that the back-end platform makes accessible to remote client stations the data set defining the coordination issue.

6. The computing system of claim 1, wherein the computing system further comprises program instructions that are executable by the at least one processor to cause the computing system to:
present at least one visual summary of an aggregate of additional data sets defining additional coordination issues that relate to additional aspects of the construction project.

7. The computing system of claim 1, wherein the coordination issue comprises one or more of (i) an unintended intersection between two rendered objects in the portion of the rendered three-dimensional view of the construction project, (ii) insufficient clearance between two rendered objects in the portion of the rendered three-dimensional view of the construction project, or (iii) an object that is missing, misshapen, or otherwise ill-positioned in the rendered three-dimensional view of the construction project.

8. A method comprising:
rendering a three-dimensional view of a construction project;
displaying the rendered three-dimensional view of the construction project on a graphical user interface;
while displaying the rendered three-dimensional view of the construction project, receiving via the graphical user interface, an indication requesting creation of a coordination issue that relates to a portion of the rendered three-dimensional view of the construction project;

in response to the receipt of the indication, creating a data set defining the coordination issue, the data set including (i) a representation of the portion of the rendered three-dimensional view, and (ii) data indicating an assignee of the coordination issue; and causing an indication of the coordination issue to be presented to a client station associated with the assignee.

9. The method of claim 8, further comprising:
creating the data set defining the coordination issue by capturing a screenshot of at least the portion of the rendered three-dimensional view of the construction project and including the screenshot within the data set defining the coordination issue.

10. The method of claim 8, wherein causing an indication of the coordination issue to be presented to a client station associated with the assignee comprises:
sending to a back-end platform the data set defining the coordination issue; and
causing the back-end platform to send to a client station associated with the assignee a notification of the coordination issue.

11. The method of claim 8, further comprising:
presenting a summary of at least a portion of the data set defining the coordination issue; and
causing remote client stations to present respective summaries of at least a portion of the data set defining the coordination issue.

12. The method of claim 11, wherein causing remote client stations to present respective summaries of at least a portion of the data set defining the coordination issue comprises:
sending to a back-end platform the data set defining the coordination issue, such that the back-end platform makes accessible to remote client stations the data set defining the coordination issue.

13. The method of claim 8, further comprising:
presenting at least one visual summary of an aggregate of additional data sets defining additional coordination issues that relate to additional aspects of the construction project.

14. The method of claim 8, wherein the coordination issue comprises one or more of (i) an unintended intersection between two rendered objects in the portion of the rendered three-dimensional view of the construction project, (ii) insufficient clearance between two rendered objects in the portion of the rendered three-dimensional view of the construction project, or (iii) an object that is missing, misshapen, or otherwise ill-positioned in the rendered three-dimensional view of the construction project.

15. A non-transitory computer-readable storage medium having program instructions stored thereon that are executable by at least one processor to cause a computing system to:
render a three-dimensional view of a construction project;
display the rendered three-dimensional view of the construction project on a graphical user interface;
while displaying the rendered three-dimensional view of the construction project, receive, via the graphical user interface, an indication requesting creation of a coordination issue that relates to a portion of the rendered three-dimensional view of the construction project;
in response to the receipt of the indication, create a data set defining the coordination issue, the data set including (i) a representation of the portion of the rendered three-dimensional view, and (ii) data indicating an assignee of the coordination issue; and
cause an indication of the coordination issue to be presented to a client station associated with the assignee.

16. The non-transitory computer-readable storage medium of claim 15, wherein the program instructions are further executable by the at least one processor to cause the computing system to:
create the data set defining the coordination issue by capturing a screenshot of at least the portion of the rendered three-dimensional view of the construction project and including the screenshot within the data set defining the coordination issue.

17. The non-transitory computer-readable storage medium of claim 15, wherein the program instructions executable to cause the computing system to cause an indication of the coordination issue to be presented to a client station associated with the assignee comprise program instructions that are executable to cause the computing system to:
send to a back-end platform the data set defining the coordination issue; and
cause the back-end platform to send to a client station associated with the assignee a notification of the coordination issue.

18. The non-transitory computer-readable storage medium of claim 15, wherein the program instructions are further executable by the at least one processor to cause the computing system to:
present a summary of at least a portion of the data set defining the coordination issue; and
cause remote client stations to present respective summaries of at least a portion of the data set defining the coordination issue.

19. The non-transitory computer-readable storage medium of claim 18, wherein the program instructions executable to cause the computing system to cause remote client stations to present respective summaries of at least a portion of the data set defining the coordination issue comprise program instructions that are executable to cause the computing system to:
send to a back-end platform the data set defining the coordination issue, such that the back-end platform makes accessible to remote client stations the data set defining the coordination issue.

20. The non-transitory computer-readable storage medium of claim 15, wherein the program instructions are further executable by the at least one processor to cause the computing system to:
present at least one visual summary of an aggregate of additional data sets defining additional coordination issues that relate to additional aspects of the construction project.

* * * * *